United States Patent
Luo et al.

(10) Patent No.: US 12,308,353 B1
(45) Date of Patent: May 20, 2025

(54) ROTATE REDUNDANCY METHOD FOR LED ARRAY PLACEMENT TO CORRECT FRONT OF SCREEN ARTIFACTS

(71) Applicant: Apple Inc., Cupertino, CA (US)

(72) Inventors: Hong Luo, San Jose, CA (US); Lixia Zhou, Sunnyvale, CA (US); Stephen P Bathurst, Lafayette, CA (US); Tore Nauta, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 387 days.

(21) Appl. No.: 17/809,710

(22) Filed: Jun. 29, 2022

Related U.S. Application Data

(60) Provisional application No. 63/227,262, filed on Jul. 29, 2021.

(51) Int. Cl.
*H10H 20/85* (2025.01)
*H01L 25/075* (2006.01)
*H10H 20/01* (2025.01)
*H10H 20/851* (2025.01)

(52) U.S. Cl.
CPC ......... *H01L 25/0753* (2013.01); *H10H 20/01* (2025.01); *H10H 20/8513* (2025.01)

(58) Field of Classification Search
None
See application file for complete search history.

(56) References Cited

U.S. PATENT DOCUMENTS 8,794,501 B2   8/2014   Bibl et al.
10,665,578 B2  5/2020   Huitema et al.

*Primary Examiner* — Sarah K Salerno
(74) *Attorney, Agent, or Firm* — Aikin & Gallant, LLP

(57) ABSTRACT

Display panels and methods of population with arrays of light emitting diodes (LEDs) are described. In an embodiment, the display panel includes one or more stamp areas, where each stamp area includes first and second arrays of LEDs, where the second arrays of LEDs are rotated relative to the first array of LEDs.

20 Claims, 19 Drawing Sheets

ROTATE REDUNDANCY METHOD FOR LED ARRAY PLACEMENT TO CORRECT FRONT OF SCREEN ARTIFACTS

FIELD

This application claims the benefit of priority of U.S. Provisional Application No. 63/227,262 filed Jul. 29, 2021, which is incorporated herein by reference.

BACKGROUND

Field

Embodiments described herein relate to display systems.

Background Information

State of the art displays for electronic devices such as wearable devices, portable electronics, desktop computers, and televisions are based on liquid crystal display (LCD) or organic light emitting diodes (OLED) technologies. More recently, it has been proposed to incorporate emissive inorganic semiconductor-based micro LEDs into high resolution displays, with the potential for energy efficiency and being less prone to lifetime degradation and sensitivity to moisture.

In one implementation a transfer tool stamp including array of transfer heads is used to pick up an array of micro LEDs from one or more native wafer substrates and transfer the arrays of micro LEDs to a non-native receiving substrate such as a display panel. Such a transfer sequence can be used to populate display panels with monochrome or full-color micro LEDs. For example, the stamp transfer heads may be electrostatic transfer heads that operate in accordance with principles of electrostatic grippers, using the attraction of opposite charges to pick up the micro LEDs. Alternatively, the stamp transfer heads may be elastomeric stamps. In such a transfer process Van der Waal forces can be used to attach the micro LEDs to the elastomeric stamps.

SUMMARY

Display panels and methods of populating display panels with rotated arrays of LEDs are described. In an embodiment, a display panel includes a stamp area, a first array of light emitting diodes (LEDs) characterized by a first emission gradient from a first perimeter location of the stamp area to a second perimeter location of the stamp area opposite the first perimeter location, and a second array of LEDs adjacent to and overlapping the first array of LEDs, the second array of LEDs characterized by a second emission gradient that is rotated relative to the first emission gradient. In an embodiment, the second emission gradient may be rotated 180 degrees relative to the first emission gradient such that the second emission gradient is opposite of the first emission gradient from the first perimeter location of the stamp area to the second perimeter location of the stamp area. Rather than, or in addition to, characterizing the stamp areas with emission gradients between opposite perimeter locations, the stamp areas can likewise be characterized by color (or heat) maps spanning between (within) perimeter boundaries of the stamp areas, where the color maps for the first and second arrays are rotated. For example, the stamp area can include stamp area boundaries, where the second array of LEDs substantially overlaps the first array of LEDs, and the first array of LEDs and the second array of LEDs are confined by the stamp area boundaries.

In an embodiment, a display panel may be populated by placing a first array of LEDs from a first region of a donor substrate onto a first stamp area on the display panel, optionally rotating the display panel after placing the first array of LEDs, followed by placing a second array of LEDs from the first region of the donor substrate onto the first stamp area on the display panel. In this manner, the second array of LEDs is rotated relative to the first array of LEDs.

DETAILED DESCRIPTION

Figure 1:
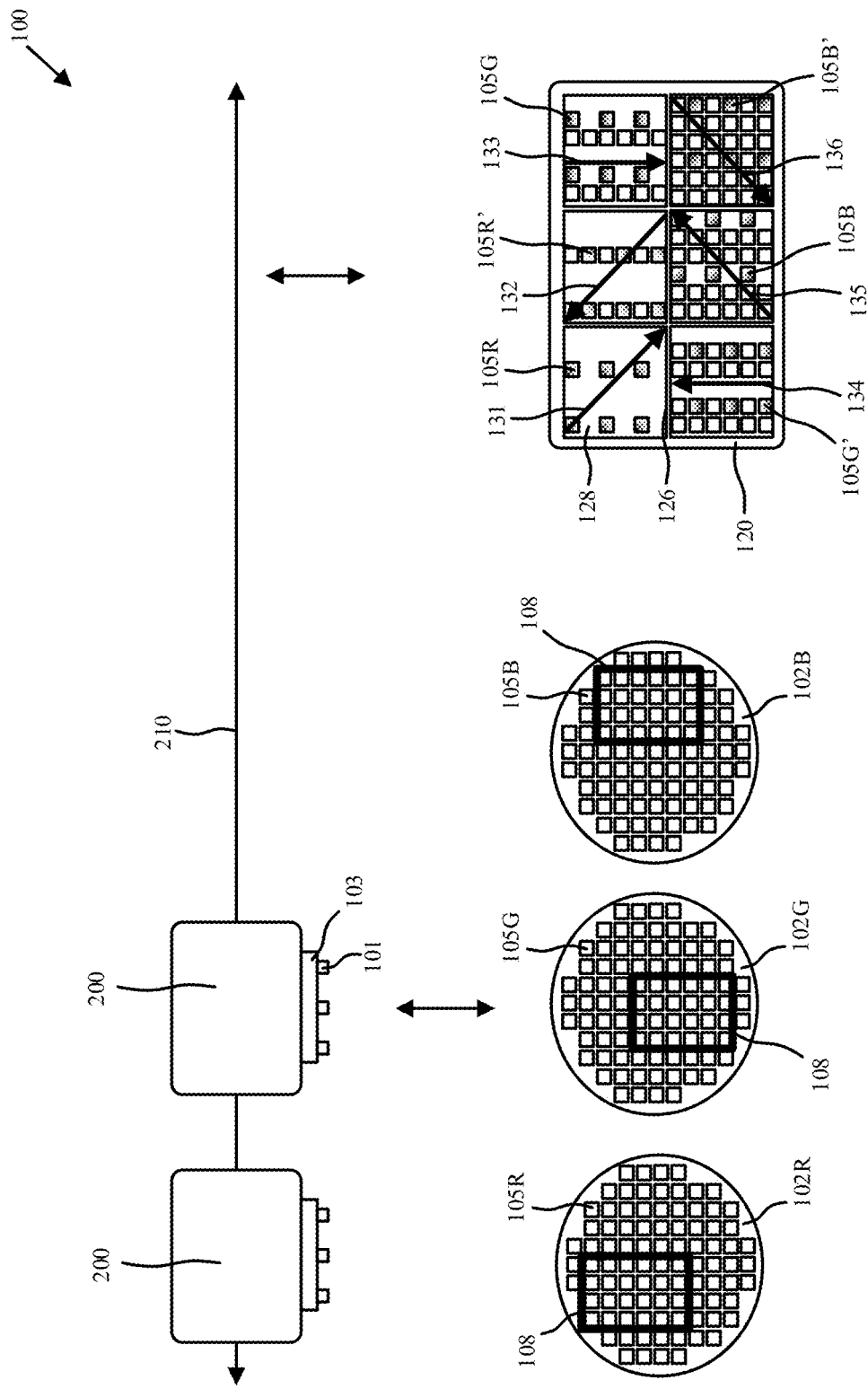
FIG. 1 is a schematic top view illustration of a transfer tool system and sequence for populating a display panel with rotated arrays of LEDs in accordance with embodiments.

Embodiments describe display panels including overlapping and rotated arrays of LEDs, which may be micro LEDs.

In an embodiment, a display panel includes a stamp area, a first array of LEDs characterized by a first emission gradient from a first perimeter location of the stamp area (e.g. along the stamp area boundary) to a second perimeter location of the stamp area opposite the first perimeter location, and a second array of LEDs characterized by a second emission gradient from the first perimeter location of the stamp area to the second perimeter location of the stamp area, where the second emission gradient is opposite of the first emission gradient. Likewise, rather than comparing emission gradients between perimeter locations, each array of LEDs may be characterized by a color (or heat) map spanning between all boundaries of the stamp area, where the color map gradients are rotated (e.g. opposite) relative to one another. For example, the stamp area can include stamp area boundaries, where the second array of LEDs substantially overlaps (or is superimposed adjacent to) the first array of LEDs, and the first array of LEDs and the second array of LEDs are confined by the stamp area boundaries. The front surface of the display panel may include an array of such stamp areas. Such emission gradients may be determined by measurable physical metrics of the LEDs, such as peak emission wavelength, full width half mass (FWHM), angular profile, efficiency, etc.

In accordance with embodiments, a display panel is assembled with multiple transfers to place LED arrays onto different segments, or stamp areas, of a screen. However, it has been observed that LED donor substrates (wafers) may have emission variations (e.g. peak emission wavelength, FWMH, etc.) across the wafers. Once the arrays of LEDs are transferred to each stamp area of a screen, there may be a sharp emission change and associated sharp color jump across the boundaries of each stamp area, which can potentially be observed by a user as a front of screen (FOS) artifact. The amount of change in visual perception between two colors is quantified by a delta E (dE) value, which represents the mathematical difference between a color input and the International Commission of Illumination (CIE) standard. The most recent formula was updated in the year 2000, and is referred to as Delta E 2000, or dE2000. While a trained eye can see down to errors of 1, a dE2000 value of less than 3 is generally not noticeable by an average person.

In one aspect, embodiments describe rotated LED arrays that may limit color jump across stamp boundaries to an unnoticeable level (i.e. less than 3 dE2000) and reduce FOS artifacts. In accordance with embodiments, a wavelength variation across one stamp area may either ramp from one side to another, or from one corner to another. The wavelength variation need not be consistent, and indeed may be irregular and include a plurality of inflections. In accordance with embodiments, a stamp area can be populated by a first array of LEDs with normal orientation, and a second array of LEDs rotated (e.g. 180 degrees) relative to the normal orientation (e.g. matching orientation from donor LED substrate). For example, the first and second arrays of LEDs can be taken from the same donor area of a donor substrate, where the display panel is rotated 180 degrees between placement of the first and second arrays. In this manner, the emission gradients across the stamp area (or alternatively the color maps within boundaries of the stamp area) on the display panel for the second array of LEDs can be reversed relative to the first array of LEDs. Where the first and second arrays are alternated or interlaced, their emission variations can be blended and the color jump across stamp boundaries can be reduced. Thus, embodiments may be used to improve display quality as well as donor wafer area utilization, and placement location flexibility.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Micro LEDs in accordance with embodiments may have a maximum dimension of less than 100 µm, or even less than 20 µm, such as less than 10 µm, or even less than 5 µm for displays with high resolution and pixel density.

Referring now to FIG. 1 a schematic top view illustration is provided of a mass transfer tool 100 and sequence for populating a display panel 120 (or other receiving substrate) with rotated arrays of LEDs in accordance with embodiments. The mass transfer tool (MTT) 100 may include one or more articulating transfer head assemblies 200, each for picking up an array of LEDs from a carrier (donor) substrate held by a carrier substrate stage and for transferring and releasing the array of micro devices onto a receiving substrate (e.g. display panel) held by a receiving substrate stage. Operation of MTT 100 and articulating transfer head assembly 200 may be controlled at least in part by a computer.

The one or more articulating transfer head assemblies 200 may each include an actuator assembly for adjusting a stamp 103 retained by the transfer head assembly with at least three degrees of freedom, e.g., tipping, tilting, and movement in a z direction, based on feedback signals received from various sensors of the MTT 100. The computer may also control movement of the articulating transfer head assembly 200 along translation track 210 (e.g. x direction) over the donor substrate stage(s) and receiving substrate stage(s). Separate donor substrates may be held by different stages. In the embodiment illustrated, a red LED donor substrate 102R, a green LED donor substrate 102G, and blue LED donor substrate 102B may each be held by separate stages. Similarly, the display panel 120 may be held by a receiving substrate stage.

Additional actuators may be provided, e.g., between mass transfer tool 100 structural components and articulating transfer head assembly 200, donor substrate stage(s), or receiving substrate stage(s), to provide movement in the x, y, or z direction for one or more of those sub-assemblies. For example, a gantry may support articulating transfer head assembly 200 and move articulating transfer head assembly 200 along an upper beam, e.g., in a direction parallel to an axis of motion of translation track 210. Thus, an array of transfer heads 101 on stamp 103, supported by transfer head assembly 200, and a target substrate (e.g. donor substrate or display panel) may be precisely moved relative to each other within all three spatial dimensions.

The articulating transfer head assembly 200 in accordance with embodiments may provide for negligible lateral or vertical parasitic motion for small movements of stamp 103, e.g., motion less than about 5 mrad about a neutral position. In an embodiment, the articulating transfer head assembly includes a tip-tilt assembly and a piezoelectric stage assembly to provide six degrees of motion. Specifically, the tip-tilt assembly may provide tip (θx) and tilt (θy), where the piezoelectric stage assembly provides z motion, x motion, y motion, and rotation (θz). The stamp 103 can be mounted on the articulating transfer head assembly 200 using suitable techniques such as electrostatic clamps, vacuum, or mechanical clips.

Figure 2:
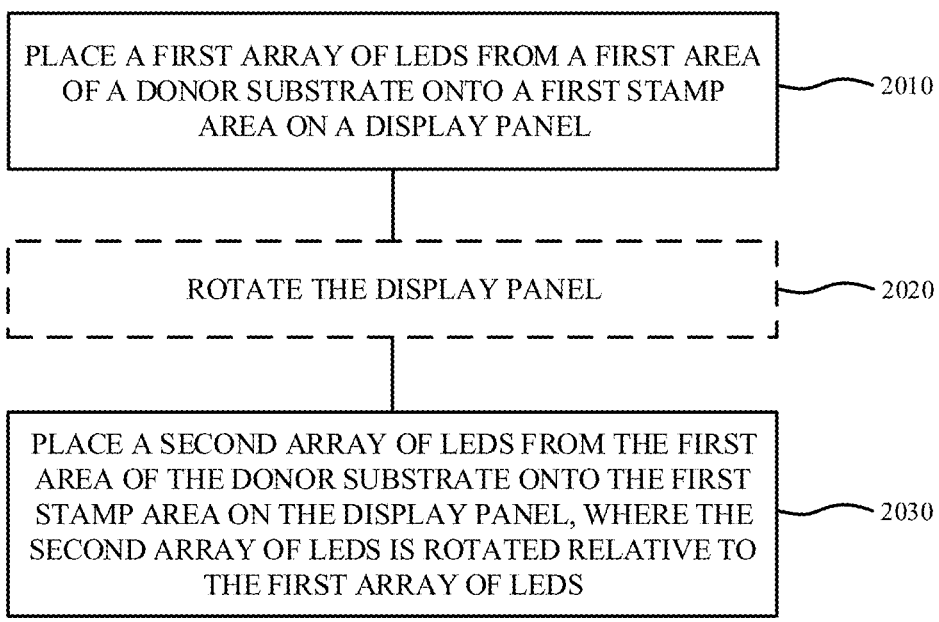
FIG. 2 is a flow chart for a method of populating a display panel with rotated arrays of LEDs in accordance with an embodiment.

FIG. 2 is a flow chart for a method of populating a display panel 120 with rotated arrays of LEDs in accordance with an embodiment. At operation 2010 a first array of LEDs 105 (primary array) from a first region 108 (stamp area) of an LED donor substrate 102 is placed onto a first stamp area 128 of a display panel 120. In an embodiment, the display panel 120 (and receiving substrate holder) can optionally be rotated, for example 180 degrees, at operation 2020. At operation 2030 a second array of LEDs 105 (secondary array) also from the same first region 108 of the LED donor substrate 102 is placed onto the first stamp area 128 of the display panel 120, where the second array of LEDs 105 is rotated relative to the first array of LEDs 105. In accordance with embodiments, rather than rotating the display panel 120 at operation 2020, a corresponding articulating transfer head assembly 200 can be rotated, or one of the donor substrate holders can be rotated prior to a pick up operation.

Referring again to FIG. 1, the exemplary display panel 120 illustrated includes six adjacent stamp areas 128 with shared stamp boundaries 126. It is to be appreciated this is exemplary, and a larger or smaller number of stamp areas 128 can exist. Furthermore, each stamp area 128 is illustrated at a separate stage of the population sequence in order to further illustrate rotation of the LED arrays. As will become apparent in the following description, a variety of sequences can be utilized to populate a display panel 120 including single or multiple stamps 103, rotation of separate components (transfer head assemblies 200, LED donor substrate 102, or display panel 120), and order of populating different color emitting LEDs 105.

In an exemplary sequence, a stamp 103 and corresponding transfer heads 101 are contacted with an array of LEDs on a first region 108 (stamp area) of a donor substrate. For illustrative purposes only, a stamp 103 held by a first articulating transfer head assembly 200 is contacted with an array of red emitting LEDs 105R on a red LED donor substrate 102R. This may be followed by contacting a second stamp 103 held by a second articulating transfer head assembly with a second array of red emitting LEDs 105R' on the red LED donor substrate 102R. For example, both arrays may be located within the same region 108 (stamp area), which may be approximately the same size as the transfer head 101 arrays on the stamps 103. The articulating transfer head assemblies can then be translated toward the receiving substrate holder holding the display panel 120. In an embodiment, the first stamp 103 holding the first array of red emitting LEDs 105R is then aligned over the first stamp area 128 (upper left hand corner) on the display panel 120, and the first array of red emitting LEDs 105R is then contacted with and placed onto the display panel 120. In an exemplary embodiment, the display panel 120 may then be rotated (e.g. 180 degrees) followed by placing the second array of red emitting LEDs 105R' onto the display panel 120 adjacent to the first array of red emitting LEDs 105R and within the same stamp area 128. Such a configuration is shown in the top middle stamp area 128 in FIG. 1.

In accordance with embodiments, the first array of LEDs 105R (e.g. red emitting LEDs 105R in upper hand corner stamp area 128) is characterized by a first emission gradient 131 from a first perimeter location (top left corner) of the stamp area 128 (along the stamp area boundary) to a second perimeter location (bottom right corner) of the stamp area (along the stamp area boundary) opposite the first perimeter location. Referring now to the top middle stamp area 128, the second array of LEDs 105R' is adjacent the first array of LEDs 105R and is characterized by a second emission gradient 132 that is rotated relative to the first emission gradient 131. For example, the second emission gradient 132 may be rotated 180 degrees relative to the first emission gradient 131 such that the second emission gradient 132 is opposite of the first emission gradient 131 from the first perimeter location of the stamp area to the second perimeter location of the stamp area. Other angles of rotation can also be implemented where applicable to reduce FOS artifacts, such as 90 degrees, etc.

It is to be appreciated that while the emission gradients illustrated in FIG. 1 are shown as extending diagonally, vertically, horizontally, etc. between two opposite locations, this is a simplified illustration for the array of LEDs, which may have a more complex emission gradient profile across the regions 108 and stamp areas 128.

As shown, this population sequence can then continue for populating the display panel 120 with green emitting LEDs 105G from the green LED donor substrate 102G, and the blue emitting LEDs 105B from the blue LED donor substrate 102B. In order to illustrate various different emission gradients the first and second arrays of green emitting LEDs 105G, 105G' are shown as having a top side to bottom side emission gradient 133 and opposite bottom side to top side emission gradient 134. Likewise, the first and second arrays of blue emitting LEDs 105B, 104B' are shown as having a bottom left corner to top right corner emission gradient 135 and opposite top right corner to bottom left corner emission gradient 136. Each of the emission gradients 131-136 in accordance with embodiment may correspond to an emission characteristic, such as peak emission wavelength, full width half mass (FWHM), angular profile, efficiency, etc., for each LED in a segment of LEDs between the two opposite locations of the stamp area 128. Such an emission gradient may be characteristic of emission variation of the LEDs across the corresponding regions 108 (stamp areas) on the donor substrates. It has been observed that LED donor substrates may have different emission gradients across different regions within a same donor substrate, and emission gradients can differ from donor substrate to donor substrate.

It is to be appreciated that while the population sequence is illustrated as having rotated second arrays of LEDs for each color-emitting LED, this is not required. In some embodiments, rotation may be provided for only a single color-emitting LED array (e.g. single sub-pixel color), or multiple color-emitting LED arrays but not all (e.g. multiple sup-pixels, but not all sub-pixels within a pixel).

In the above described population sequence the display panel 120 may be rotated between placement of the primary and secondary arrays of LEDs for each color emission. However, embodiments are not so limited. For example, primary arrays of different color emitting LEDs can be populated followed by rotation of the display substrate and placement of the secondary arrays of different color emitting LEDs. Alternatively, the articulating transfer head arrays 200 can be rotated. In yet another alternative, the donor substrates can be rotated between pick up operations. Thus, rotated LED arrays can be populated using a variety of population sequences.

Figure 3:
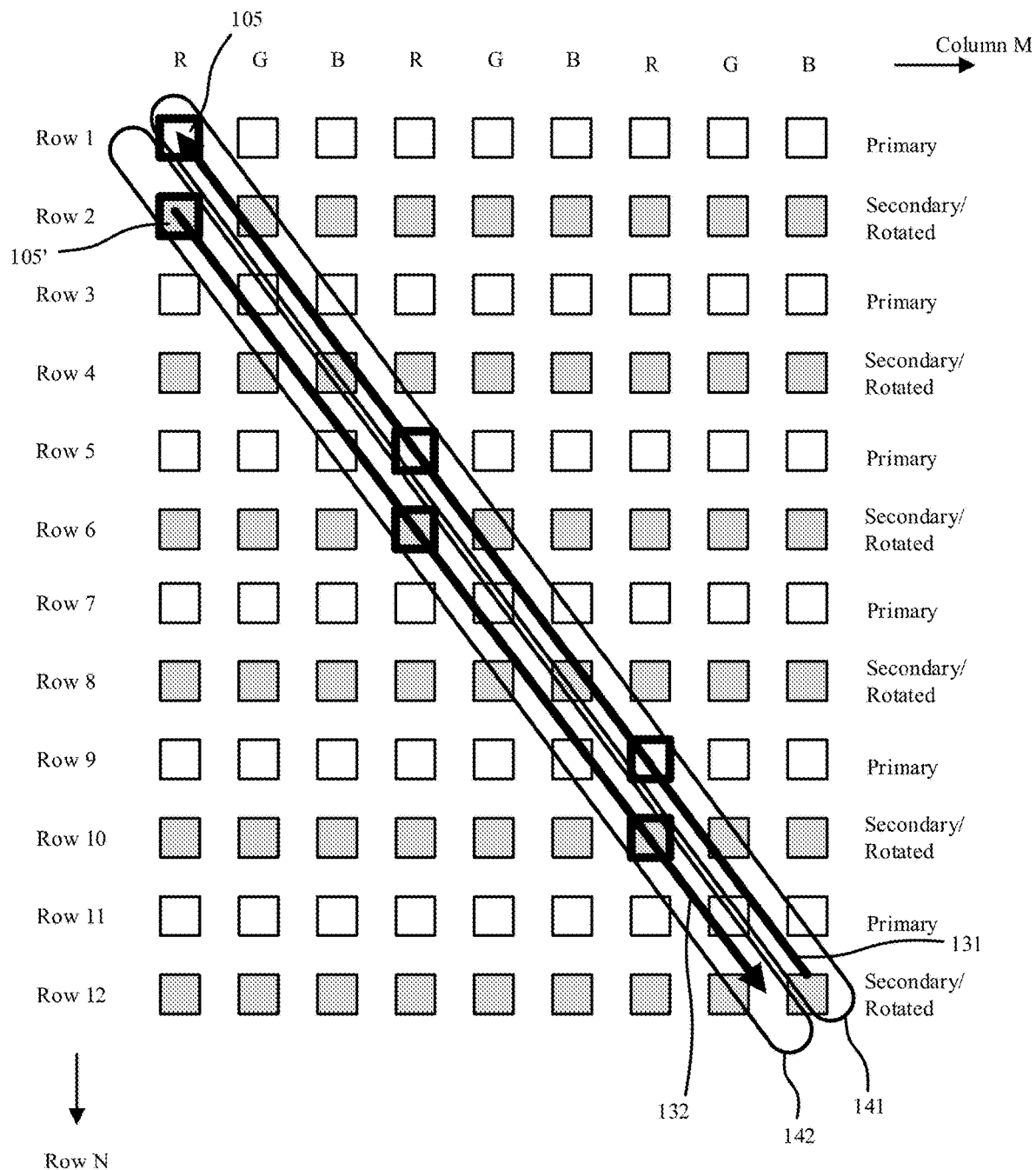
FIG. 3 is a close-up schematic top view illustration of rotated arrays of LEDs including segments of LEDs with opposite emission gradients in accordance with an embodiment.

FIG. 3 is a close-up schematic top view illustration of rotated arrays of LEDs including segments of LEDs with opposite emission gradients in accordance with an embodiment. Specifically, FIG. 3 is a close-up illustration of a stamp area 128 including M columns and N rows of LEDs, where the segments 141, 142 of LEDs are illustrated in bold outline where overlapping corresponding emission gradients 131, 132. More specifically, FIG. 3 illustrates a pixel arrangement of red/green/blue (R/G/B) emitting LEDs arranged in rows. The alternating secondary rows may be rotated relative to primary rows, though this is not required for all color-emitting LEDs in accordance with embodiments.

The particular embodiment of FIG. 3 illustrates, a first segment 141 including emission gradient 131 of the first array of red emitting LEDs 105R (primary array), and a second segment 142 including emission gradient 132 of the second array of red emitting LEDs 105R' (secondary array). In the exemplary illustration, the emission gradient 132 is rotated 180 degrees relative to the emission gradient 131. It is to be appreciated that while segments are illustrated for the red emitting LEDs, that similar segments (with different orientations) can exist for the other color emitting LEDs. Furthermore, it is to be appreciated that characterization of the emission gradients for segments of LEDs can be part of more complex color maps of the corresponding arrays of LEDs within boundaries of the stamp areas.

The primary arrays of LEDs and secondary (rotated) arrays of LEDs can be included in a variety of pixel arrangements. For example, in the embodiment illustrated in FIG. 3, alternating rows of LEDs (or groups of rows) can be rotated. Similarly alternating columns of LEDs, or groups of columns, can be rotated. In some embodiments, both the primary arrays of LEDs and the secondary (rotated) arrays of LEDs are configured to be active. The primary array of LEDs and secondary (rotated) arrays of LEDs can also be integrated in a redundancy configuration, where not all LEDs are expected to be active. That is working circuitry of the display panel can be configured to operate one, or the other, of a redundant pair of LEDs.

Figure 4:
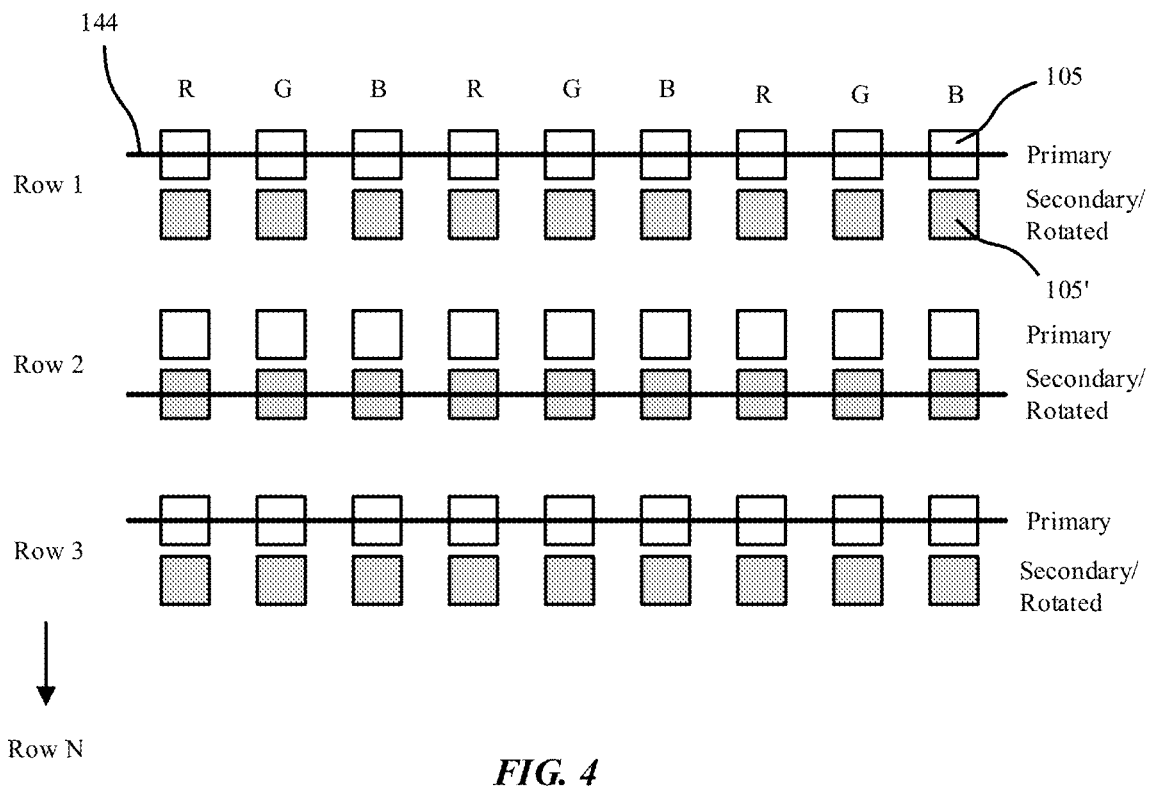
FIG. 4 is a close-up schematic top view illustration of rotated redundant rows of LEDs with alternating connections in accordance with an embodiment.

FIG. 4 is a close-up schematic top view illustration of rotated redundant rows of LEDs with alternating connections in accordance with an embodiment. As shown, each display row (Row 1, Row 2, . . . . Row N) can include a pair of primary LEDs 105 and secondary LEDs 105' for each sub-pixel, where the secondary LEDs 105' are rotated relative to the primary LEDs 105. In the particular embodiment illustrated, a solid line is drawn through activated LEDs, where LEDs not connected to the solid line are inactive. For example, the solid line can be an electrically conductive, and transparent or semi-transparent, top contact layer 144 (e.g. cathode, or anode) selectively formed over either the primary LEDs 105 or secondary LEDs 105'. In an embodiment, the display rows alternate with primary LEDs 105 or secondary LEDs 105' being active. It is to be appreciated, this is merely an illustrative example, and activation can instead be controlled by working circuitry within the display panel 120.

Figure 5:
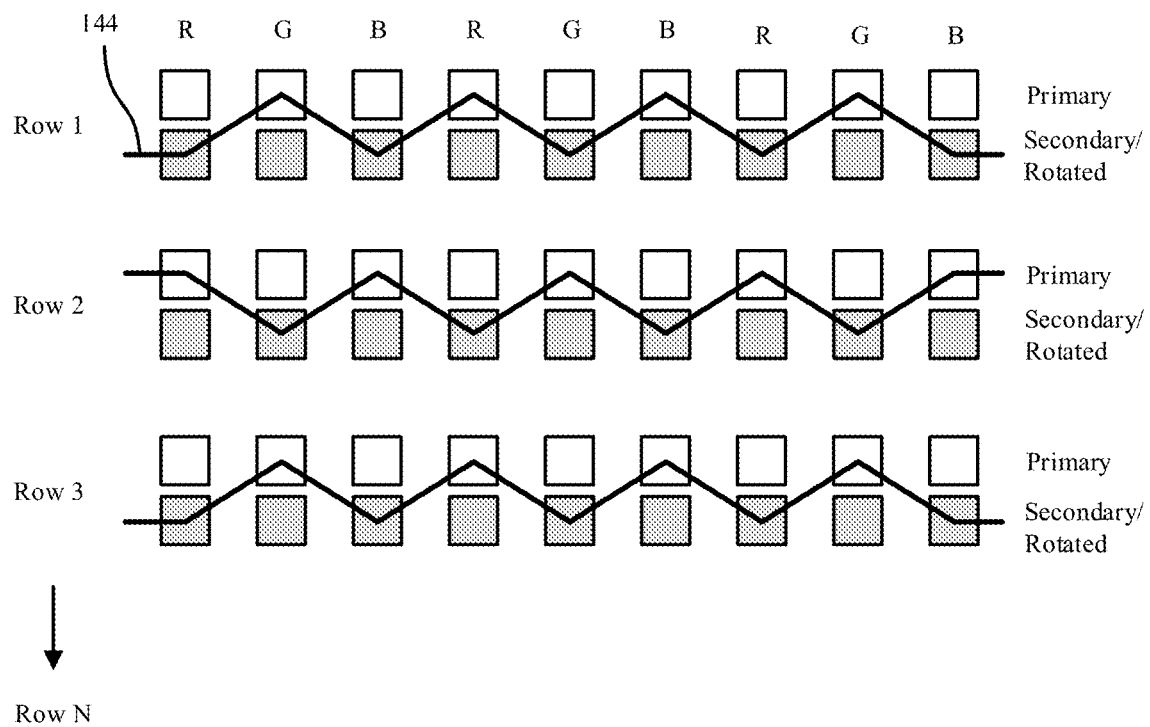
FIG. 5 is a close-up schematic top view illustration of rotated redundant rows of LEDs with interlaced connections in accordance with an embodiment.

FIG. 5 is a close-up schematic top view illustration of rotated redundant rows of LEDs with interlaced connections in accordance with an embodiment. FIG. 5 is similar to FIG. 4 with one difference being that both primary LEDs 105 and secondary LEDs 105' within the same display rows can be activated, for example, with interlaced top contact layer 144, etc.

Figure 6:
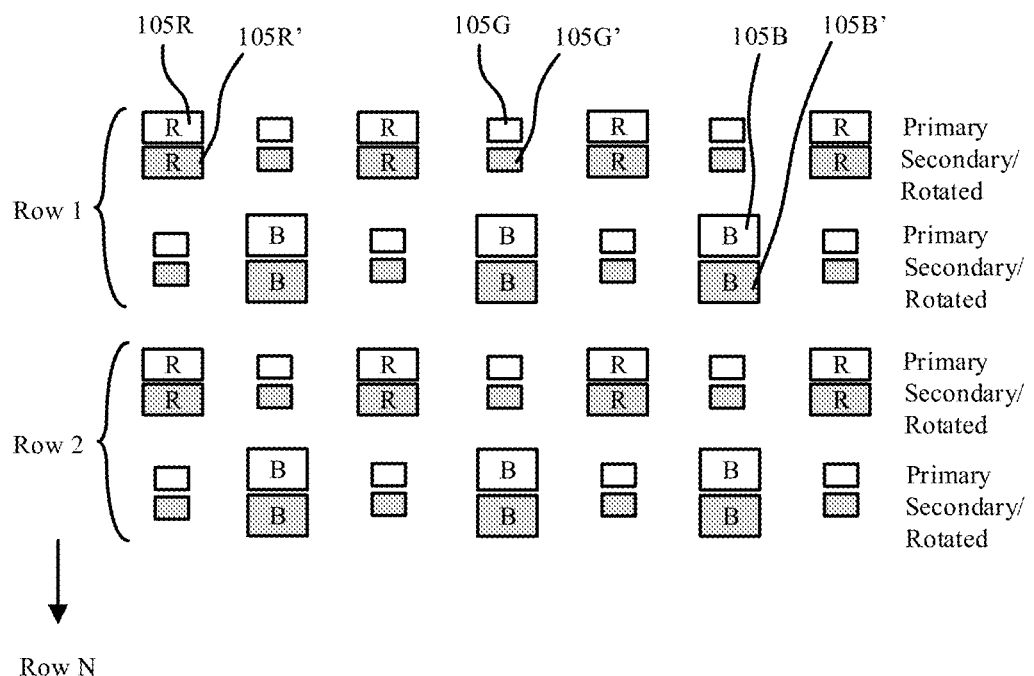
FIG. 6 is a close-up schematic top view illustration of a diamond pixel arrangement with rotated redundant LEDs per sub-pixel in accordance with an embodiment.
Figure 7:
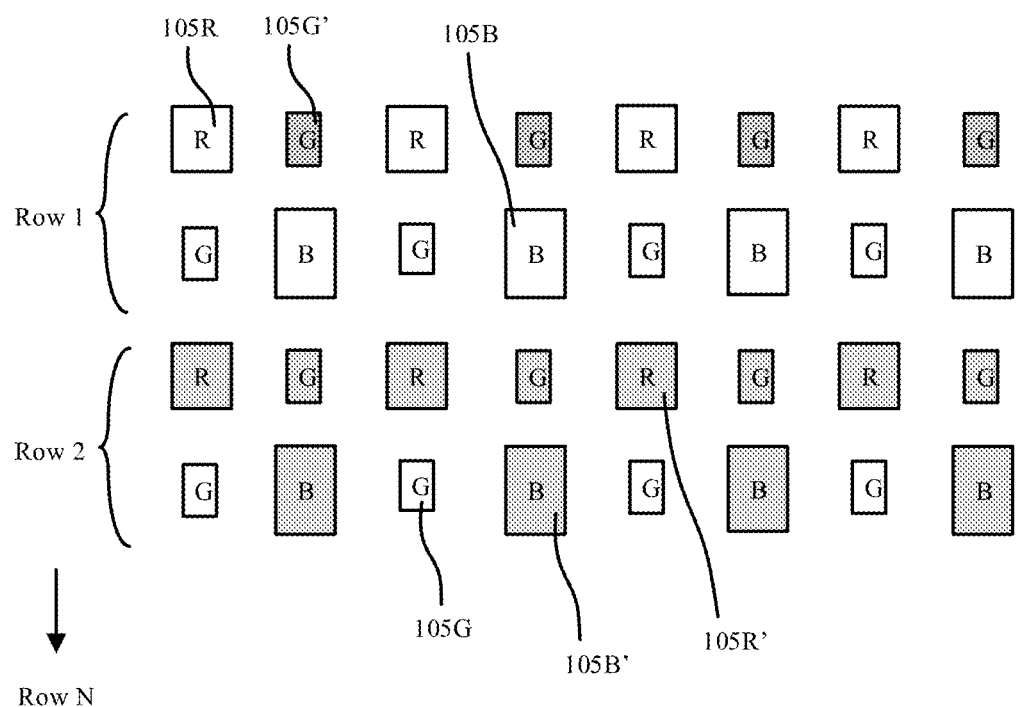
FIG. 7 is a close-up schematic top view illustration of a diamond pixel arrangement with rotated rows of LEDs in accordance with an embodiment.

It is not required to have a row-wise pixel arrangement with all sub-pixels in the same row. Other pixel arrangement such as, but not limited to diamond pixel arrangements, can be used. FIG. 6 is a close-up schematic top view illustration of a diamond pixel arrangement with rotated redundant LEDs per sub-pixel in accordance with an embodiment. FIG. 6 resembles the sub-pixel redundancy of FIGS. 4-5. FIG. 7 is a close-up schematic top view illustration of a diamond pixel arrangement with rotated rows of LEDs in accordance with an embodiment. FIG. 7, like FIG. 3, does not illustrate redundancy within sub-pixels. In either diamond pixel arrangement, multiple rows of LEDs may be included within a display row including all sub-pixel colors. Additionally, various integration/activation schemes such as alternating rows top contact layers 144 of FIG. 4, or interlaced top contact layers 144 of FIG. 5, can be integrated into the diamond pixel arrangements of FIGS. 6-7.

It is to be appreciated that while the arrays of secondary LEDs 105' are illustrated as being rotated, this is not required for all of the color-emitting secondary LEDs 105'. Arrays of primary LEDs 105 and secondary LEDs 105' can be similarly arranged, with rotation occurring in single sub-pixel colors, all sub-pixel colors, or a combination of more than one, but less than all sub-pixel colors.

Figure 8:
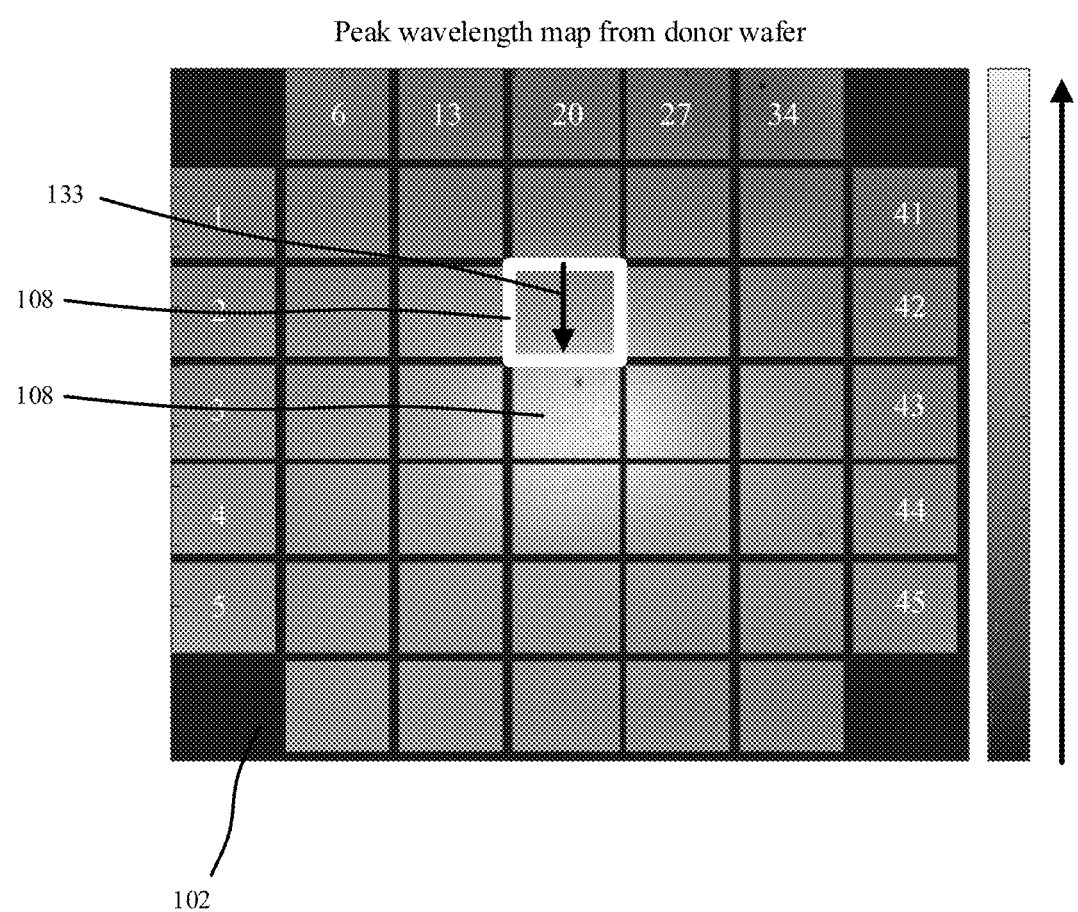
FIG. 8 is a top view image and color map of an emission gradient across stamp regions of an LED donor wafer in accordance with an embodiment.

Referring now to FIG. 8 an exemplary top view image and color map of an emission gradient across stamp regions of an LED donor substrate 102 is provided in accordance with an embodiment. Such a color map can be generated by measuring the photoluminescence for each LED on the LED donor substrate 102 to determine peak emission wavelength from each LED. In the particular illustration provided, there are a total of 45 regions 108, each region including arrays of LEDs that are poised for pick up and transfer to a display substrate. For example, adjacent LEDs on LED donor substrate 102 may be located more closely together than the transfer heads 101 on a stamp 103, such that multiple arrays of LEDs can be picked up from a same region 108. Regions 108 may have approximately a same area as transfer head 101 array on the stamps 103 (or slightly larger) to accommodate multiple picks. In accordance with embodiments, the gradient from dark to bright may represent a peak emission wavelength gradient (high to low wavelength) for the individual LEDs across the LED donor substrate 102. For example, a maximum variation across a region 108 may be less than 10 µm, or more specifically less than 6 µm depending upon emission color. Inversely, the scale from dark to bright may represent a full width half mass (FWMH) gradient (low to high value) for the individual LEDs across the LED donor substrate 102. For example, a maximum FWHM variation across a region may be less than 10 µm, or more specifically less than 6 µm depending upon emission color. The rotation methods in accordance with embodiments may allow for larger maximum variation, and hence increased amount of LED donor substrate 102 utilization.

The particular emission gradient across (stamp) regions 108 of an LED donor substrate 102 FIG. 8 is meant to be generally applicable for all LED color emissions. Furthermore, the gradient can have different patterns across the LED donor substrate 102, and across different regions 108. By way of exemplary illustration, where the LED donor substrate 102 is a green LED donor substrate, the highlighted region 108 of FIG. 8 may have an emission gradient 133, similar to that illustrated in FIG. 1.

Referring now to FIGS. 9-11B an FIGS. 12-14B display panel LED layouts are described with and without rotated LED arrays in order to illustrate potential impact on FOS artifacts due to color shifts at stamp area boundaries.

Figure 9:
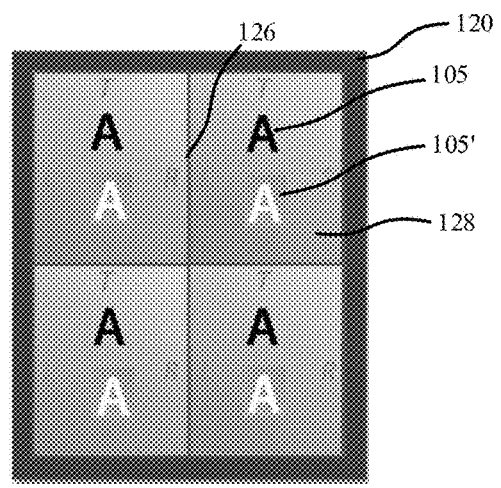
FIG. 9 is a schematic top view illustration of a stamp method including placement of primary and secondary LEDs with the same orientation within stamp areas on a display panel.

FIG. 9 is a schematic top view illustration of a stamp method including placement of primary LEDs 105 and secondary LEDs 105' with the same orientation within stamp areas 128 on a display panel 120. In this illustration, the stamp areas 128 do not overlap and border one another with stamp boundaries 126 along sides of the stamp areas 128.

Figure 10A:
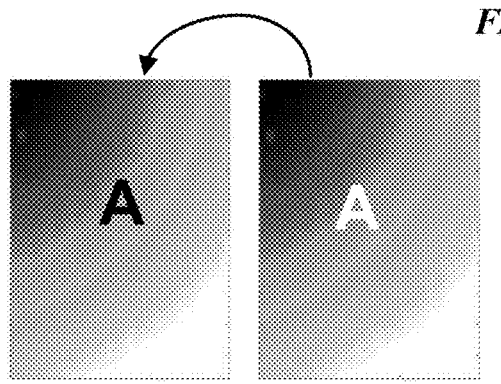
FIG. 10A is a top view image and color map of a primary array of LEDs and secondary array of LEDs with a corner-to-corner emission gradient taken from a same stamp region of a donor substrate.
Figure 10B:
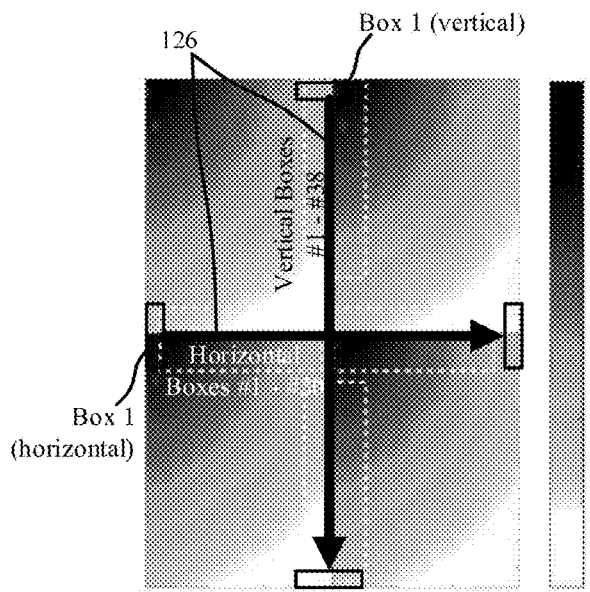
FIG. 10B is a top view image and color map of adjacent stamp areas on a display panel including primary and secondary arrays of LEDs of FIG. 10A.

FIG. 10A is a top view image and color map of a primary array of LEDs 105 and a secondary array of LEDs 105' with a corner-to-corner emission gradient taken from a same stamp region of a donor substrate. In this case the two arrays of LEDs have substantially the same emission gradient and are to be superimposed over each other. FIG. 10B is a top view image and color map of adjacent stamp areas on a display panel including primary and secondary arrays of LEDs of FIG. 10A both placed into the same stamp areas 128. As shown, sharp color shift values are measured across the boundaries 126.

Figure 11A:
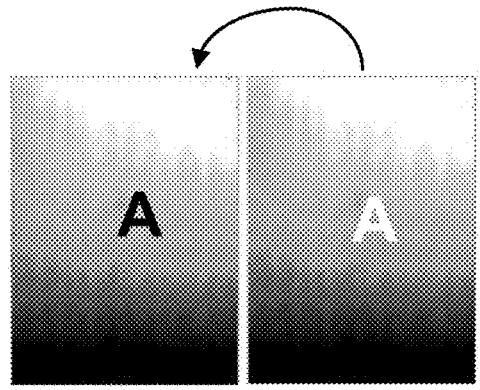
FIG. 11A is a top view image and color map of a primary array of LEDs and secondary array of LEDs with a side-to-side emission gradient taken from a same stamp region of a donor substrate.
Figure 11B:
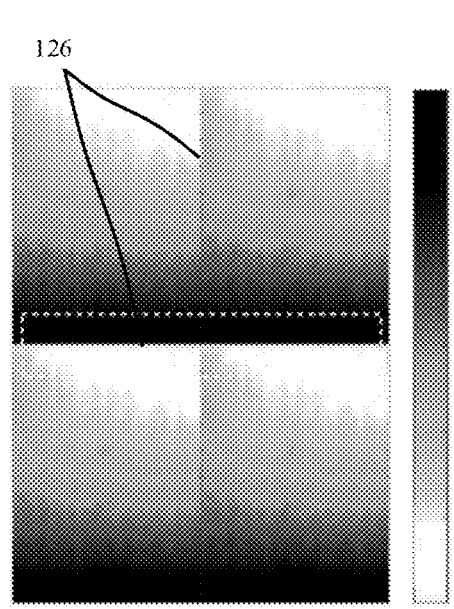
FIG. 11B is a top view image and color map of adjacent stamp areas on a display panel including primary and secondary arrays of LEDs of FIG. 11A.

FIGS. 11A-11B are similar to those of FIGS. 10A-10B showing side-to-side emission provides rather than corner-to-corner emission gradients. In this case, stamp boundary 126 regions also demonstrate sharp color shift values across the boundaries.

Figure 12:
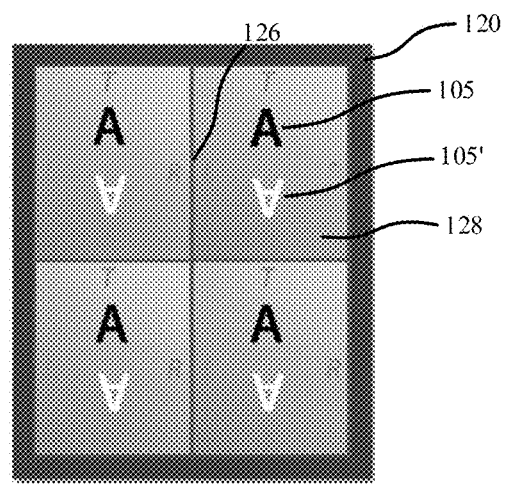
FIG. 12 is a schematic top view illustration of a stamp method including placement of primary and secondary LEDs with the rotated orientation within stamp areas on a display panel in accordance with an embodiment.

FIG. 12 is a schematic top view illustration of a stamp method including placement of a primary array of LEDs 105 and secondary array of LEDs 105' with the rotated orientation within stamp areas 128 on a display panel 120 in accordance with an embodiment.

Figure 13A:
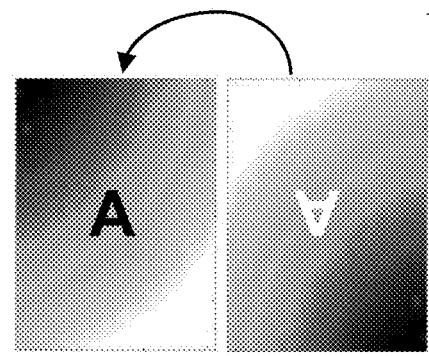
FIG. 13A is a top view image and color map of a primary array of LEDs and rotated secondary array of LEDs with a corner-to-corner emission gradient taken from a same stamp region of a donor substrate in accordance with an embodiment.
Figure 13B:
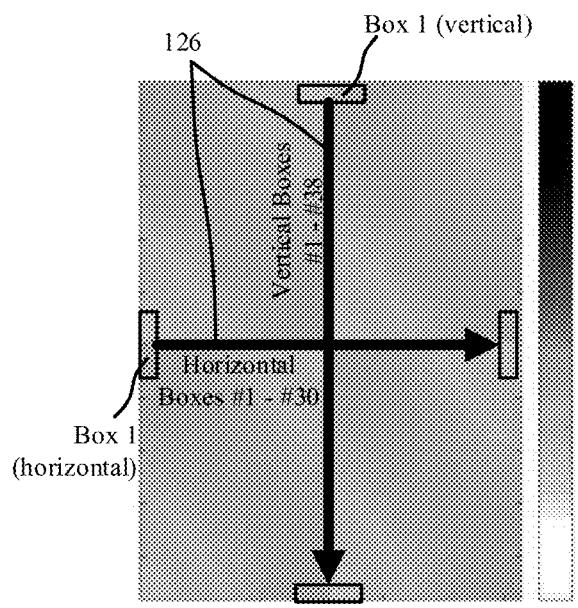
FIG. 13B is a top view image and color map of adjacent stamp areas on a display panel including primary arrays of LEDs and rotated secondary arrays of LEDs of FIG. 13A in accordance with an embodiment.

FIG. 13A is a top view image and color map of a primary array of LEDs 105 and rotated secondary array of LEDs 105' with a corner-to-corner emission gradient taken from a same stamp region of a donor substrate in accordance with an embodiment. In this case the two arrays of LEDs may be rotated 180 degrees, for example, to have substantially opposite emission gradients and are to be superimposed over each other. FIG. 13B is a top view image and color map of adjacent stamp areas on a display panel including primary arrays of LEDs and rotated secondary arrays of LEDs of FIG. 13A both placed into the same stamp areas 128 in accordance with an embodiment. As shown, significantly lower color shift is measured across stamp boundary 126 regions compared to FIG. 10B. Additionally, color shift across a stamp area 128 can also be reduced.

Figure 14A:
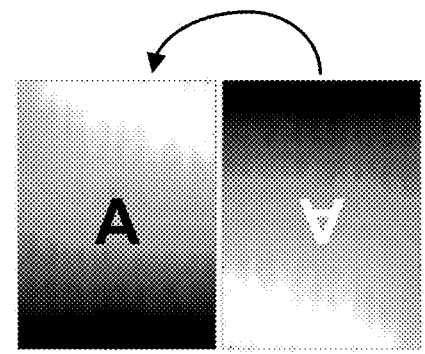
FIG. 14A is a top view image and color map of a primary array of LEDs and rotated secondary array of LEDs with a side-to-side emission gradient taken from a same stamp region of a donor substrate in accordance with an embodiment.
Figure 14B:
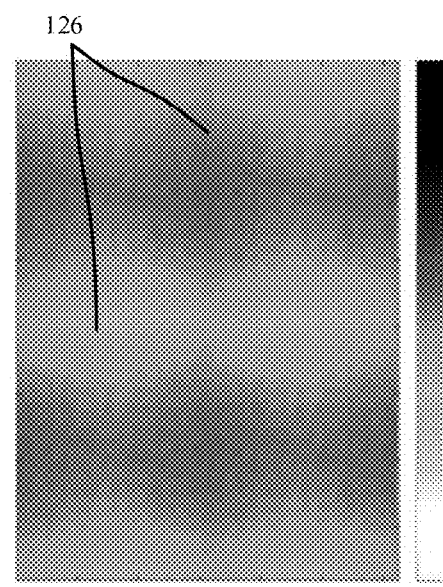
FIG. 14B is a top view image and color map of adjacent stamp areas on a display panel including primary arrays of LEDs and rotated secondary arrays of LEDs of FIG. 14A in accordance with an embodiment.

FIGS. 14A-14B are similar to those of FIGS. 13A-13B showing side-to-side emission provides rather than corner-to-corner emission gradients. In this case, stamp boundary 126 regions also demonstrate sharp color shift values across the boundaries.

Figure 15:
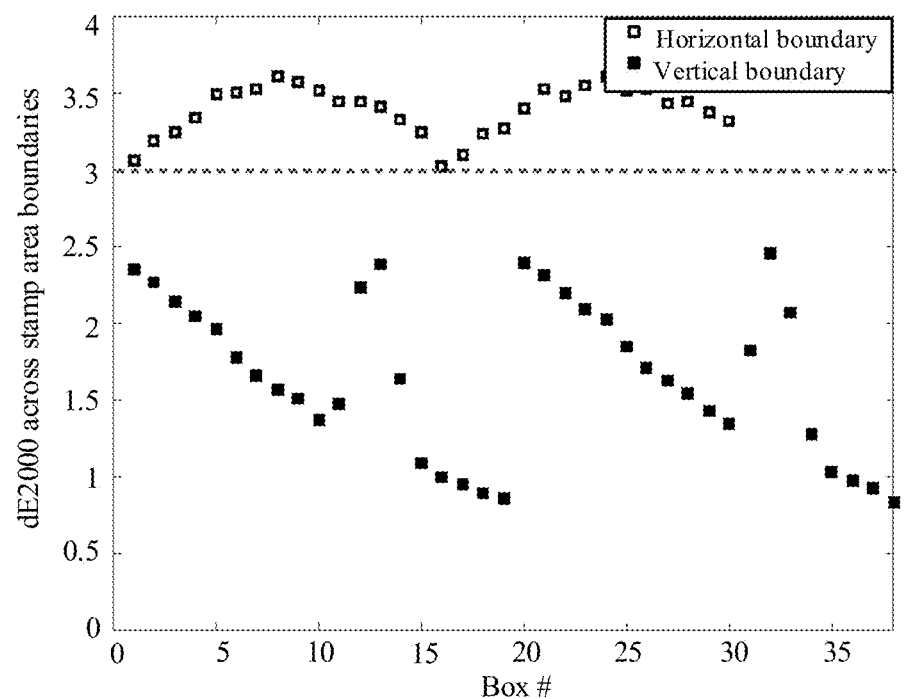
FIG. 15 is a plot of measured dE2000 across a quadrant of stamp area boundaries without rotated arrays of red, green, and blue LEDs.
Figure 16:
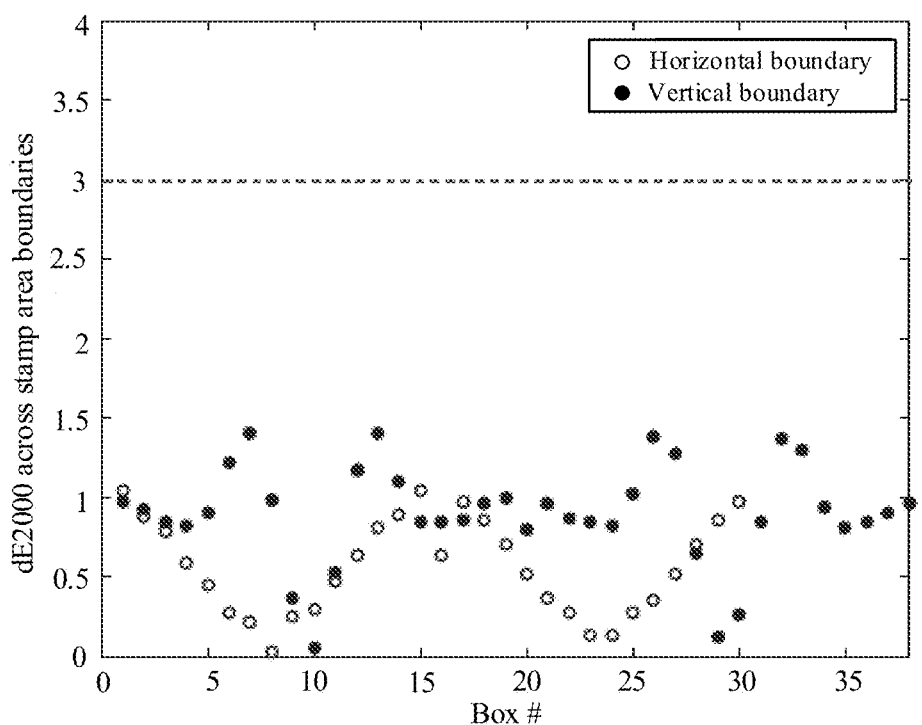
FIG. 16 is a plot of measured dE2000 across a quadrant of stamp area boundaries utilizing rotated primary and secondary arrays of red, green, and blue LEDs in accordance with an embodiment.

Taken together the emission gradients provided in FIGS. 10A-11B and FIGS. 13A-14B illustrate the qualitative and partly quantitative effect of populating stamp areas on a display panel with primary arrays of LEDs and rotated secondary arrays of LEDs from the same stamp regions of an LED donor substrate. Referring now to FIGS. 15-16 in combination with FIG. 10B and FIG. 13B, qualitative dE2000 measurements are provided along the horizontal boxes #1-30 and vertical boxes #1-38 spanning across the horizontal and vertical stamp boundaries 126 between the quadrant of stamp areas 128 of FIG. 10B and FIG. 13B. More accurately, FIG. 10B and FIG. 13B illustrate stamp areas 128 populated by LEDs from a single color emitting LED donor substrate (e.g. green). The data presented in FIGS. 15-16 illustrates cumulative qualitative dE2000 measurements across the same four stamp areas 128 for an RGB (red-green-blue) display panel after adding red-emitting and blue-emitting LEDs, where stamp area 128 size is the same for the red-emitting, green-emitting, and blue-emitting LED arrays. FIG. 15 is a plot of measured dE2000 values across a quadrant of RGB stamp area boundaries without rotated arrays of red, green, and blue LEDs. FIG. 16 is a plot of measured dE2000 values across a quadrant of RGB stamp area boundaries utilizing rotated primary and secondary arrays of red, green, and blue LEDs in accordance with an embodiment. As shown the dE2000 values across the stamp area boundaries 126 is significantly reduced using rotated LED arrays, while data for the non-rotated LED arrays shows dE2000 values along the horizontal boundaries above 3, which can potentially be visible to an ordinary observer.

Figure 17A:
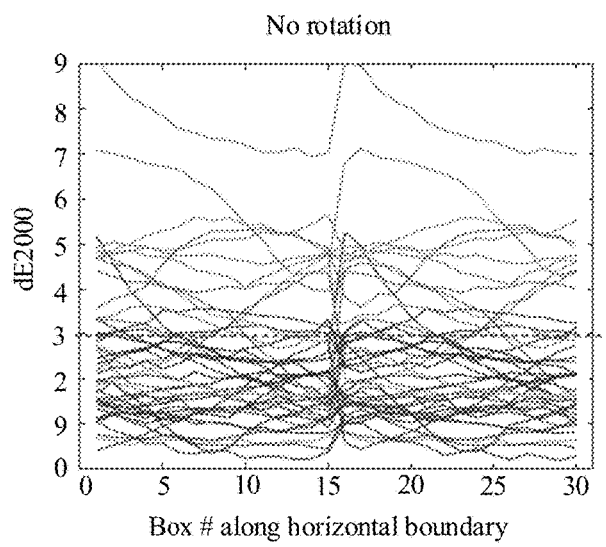
FIG. 17A is a plot of measured dE2000 along stamp area horizontal sides including primary and secondary red, green, and blue LEDs on display panel.
Figure 18A:
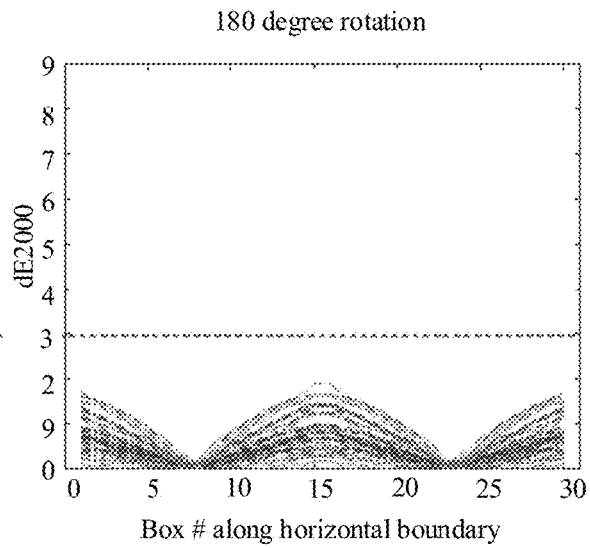
FIG. 18A is a plot of measured dE2000 along stamp area horizontal sides including primary and rotated secondary red, green, and blue LEDs on display panel in accordance with an embodiment.
Figure 17B:
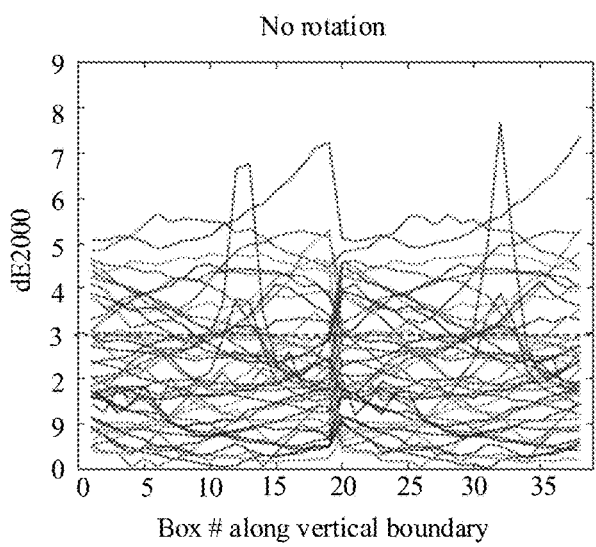
FIG. 17B is a plot of measured dE2000 along stamp area vertical sides including primary and secondary red, green, and blue LEDs on display panel.
Figure 18B:
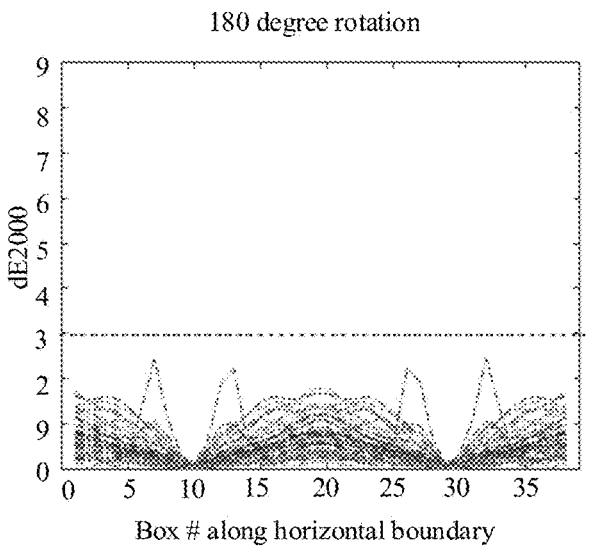
FIG. 18B is a plot of measured dE2000 along stamp area vertical sides including primary and rotated secondary red, green, and blue LEDs on display panel in accordance with an embodiment.

Taken together the dE2000 measurement data for FIGS. 15-16 illustrates the effectiveness of rotated LED arrays across adjacent stamp boundaries 126 on a display panel 120. Referring now to FIGS. 17A-18B, dE2000 measurements are provided for an RGB display panel 120 prepared with 1:1 mapping from the exemplary LED donor substrates 102R, 102G, 102B arranged to include stamp regions 108 similar to that of FIG. 8. More specifically, while FIG. 8 corresponds to a single color-emitting LED substrate, the dE2000 measurements are taken from a display panel including stamp areas populated with red-emitting, green-emitting, and blue-emitting RGB pixels. In this case an exemplary display panel 120 is fabricated where stamp regions 1-45 from LED donor substrates 102R, 102G, 102B (e.g. exemplary FIG. 8) are reproduced as stamp areas 1-45 on a display panel. In FIGS. 17A-17B the stamp areas include non-rotated arrays of primary and secondary LEDs. In FIGS. 18A-18B the stamp areas include rotated arrays of primary and secondary LEDs. Similar to FIGS. 15-16, the measurements were taken along horizontal boxes #1-30 and vertical boxes #1-38 spanning across the horizontal and vertical stamp boundaries 126 between the adjacent stamp areas 128. As shown, in FIGS. 17A-17B, without rotation placement of adjacent stamp regions onto a display panel as adjacent stamp areas results in a significant majority of dE2000 measurement values that fall above the 3. Addition of rotated LED arrays in accordance with embodiments results in all adjacent stamp areas passing the requirement of dE2000 measure values below 3 in this particular experimental result. This result suggests that rotated LED arrays in accordance with embodiments may not only improve display panel performance, but also donor wafer utilization which can both increase yield and throughput.

Up until this point display panel configurations have been described in which stamp areas 128 are separated by a boundary 126. The boundary may be nothing more than spacing between LEDs placed by different stamps 103. Non-overlapping stamp areas 128 may be practical for example where stamps 103 have a uniform transfer head 101 layout. In accordance with embodiments, including all embodiments described to this point with regard to FIGS. 1-18B, adjacent stamp areas 128 can also overlap at their sides to create fuzzy boundaries 150, where a sharp contrast between stamp areas 128 can instead be blended over a certain distance. Implementation of fuzzy boundaries 150 may also be incorporated in accordance with embodiments without LED array rotation.

Figure 19:
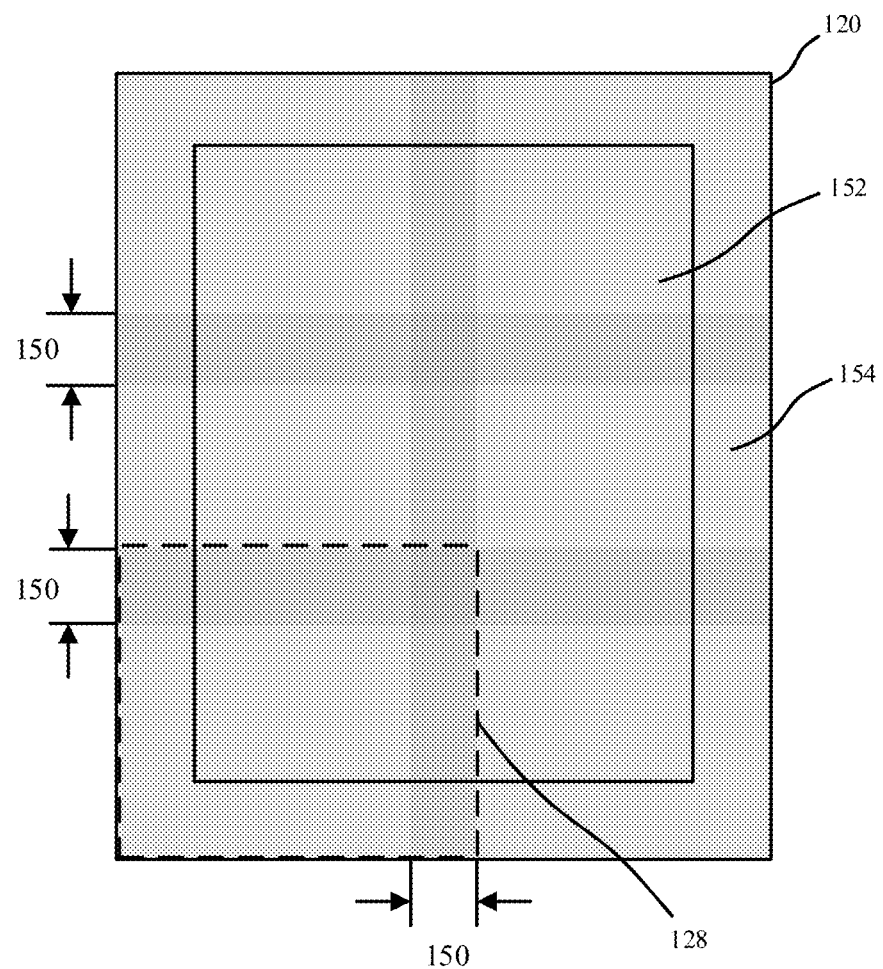
FIG. 19 is a schematic top view illustration of a display panel including overlapping stamp areas to create fuzzy boundaries in accordance with an embodiment.
Figure 20:
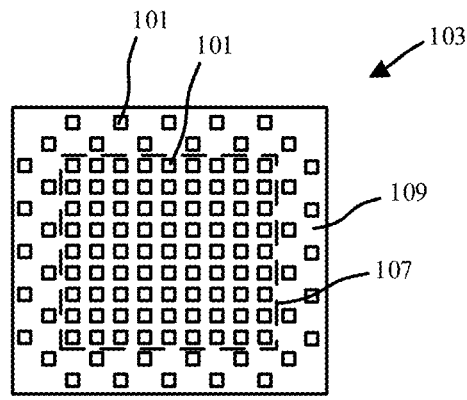
FIG. 20 is a schematic bottom view illustration of a stamp including an arrangement of transfer heads to accommodate overlapping stamp areas in accordance with an embodiment.

FIG. 19 is a schematic top view illustration of a display panel 120 including overlapping stamp areas 128 to create fuzzy boundaries 150 in accordance with an embodiment. FIG. 20 is a schematic bottom view illustration of a stamp 103 including an arrangement of transfer heads 101 to accommodate overlapping stamp areas in accordance with an embodiment. Referring to both FIGS. 19-20, stamps 103 can place arrays of LEDs onto stamp areas 128 sequentially. Each stamp 103 may include a high density transfer head 101 array in an interior area 107, and lower density transfer head 101 array along an exterior border area 109 of the stamp 103. When stamp areas 128 overlap, the exterior border areas 109 may overlap such that LED held by corresponding transfer heads 101 are placed in an overlapping, complementary fashion to match a density of the interior area 107 transfer heads 101. The resulting display panel 120 of FIG. 19 may therefore include an corresponding exterior border area 154 with lower density of LEDs than an interior display area 152. The exterior border area 154 may optionally be trimmed before final product integration.

Figure 21:
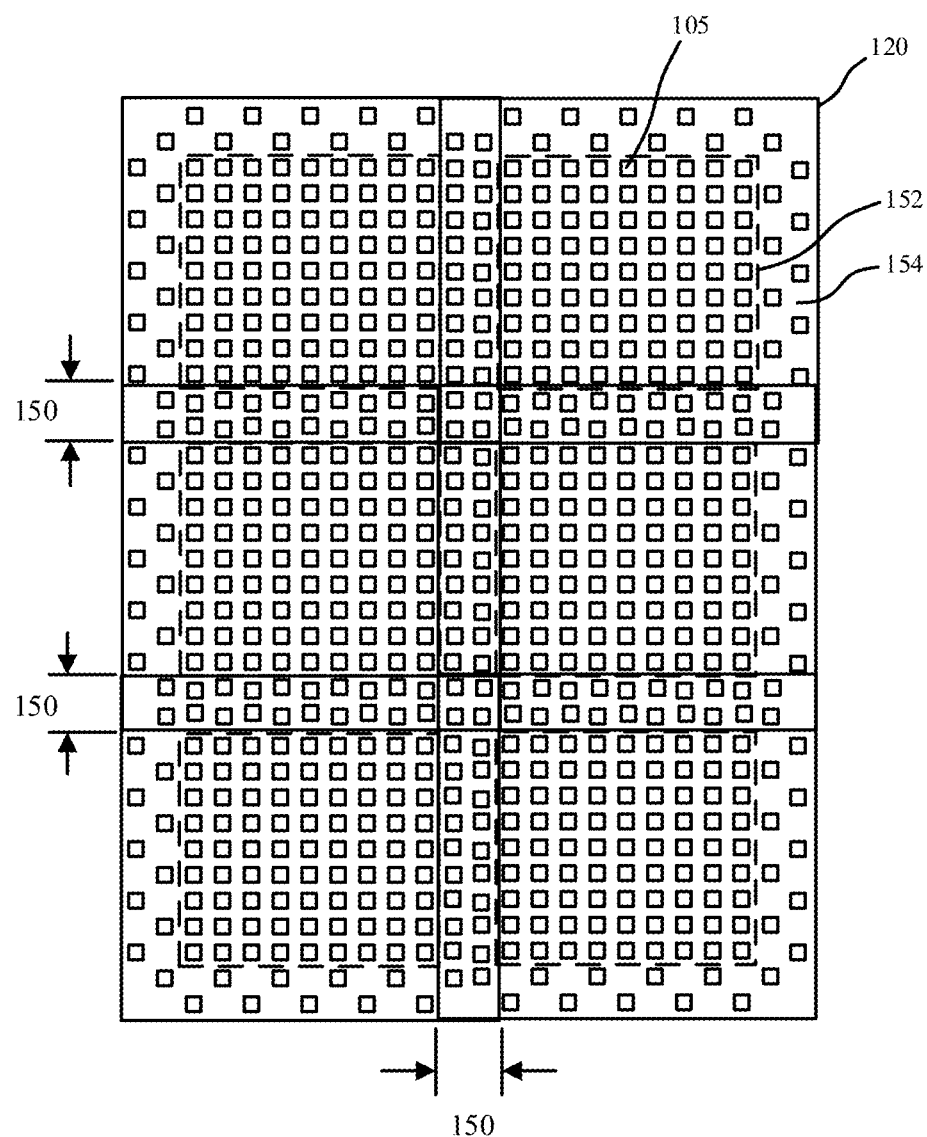
FIG. 21 is a schematic top view illustration of a display panel including an arrangement of LEDs and overlapping fuzzy boundaries in accordance with an embodiment.

Referring again to FIG. 20, in the illustrated embodiment, the exterior border area 109 of stamp 103 can include multiple rows/columns of transfer heads 101 with lower density than the rows/columns of transfer heads in the interior area 107. The rows/columns of transfer heads 101 in the exterior border area 109 may be staggered, for example as checkerboard pattern, to accommodate overlapping placements. Notably, the exterior-most rows/columns are missing transfer heads 101 where the pattern would naturally suggest at their corners (e.g. where rows, and columns intersect). This particular feature may allow the overlapping of four (4) stamp areas 128. This is illustrated in FIG. 21, where a schematic top view illustration is provided of a display panel 120 including an arrangement of LEDs 105 and overlapping fuzzy boundaries 150 in accordance with an embodiment. As shown, the placement of LEDs from four overlapping stamps onto the display substrate using the stamp 103 arrangement of FIG. 20 results in a consistent LED distribution in the specific overlapped region.

While the illustration provided in FIG. 21 is made with regard to overlapping LEDs stamp arrays for single color emitting LED arrays, this may of course be extended to multiple colors, as well as rotational arrays, and redundancy configurations. Multiple stamps 103 with different transfer head 101 layouts may also be utilized.

FIGS. 22A-22E are schematic bottom view illustrations of stamps 103 and top view illustrations of display panels 120 illustrating a process flow for populating a display panel 120 with overlapping stamp areas in accordance with an embodiment. As shown, the population sequence can include at least two stamps 103A, 103B with separate and complementary patterns of transfer heads 101. In an embodiment, each stamp 103A, 103B may be used to transfer a corresponding primary array of LEDs 105, and secondary array of LEDs 105' which may be rotated. Still referring to FIGS. 22A-22B, the interior areas 107 may have alternating rows or columns of transfer heads 101, while the exterior border areas 109 may have concentric/overlapping rings/outlines (which may be square) of transfer heads 101, also with lower density than within the interior areas 107. Similarly, the outermost corner regions of stamps 103A may be missing transfer heads 101 from the natural patterns to accommodate overlapping of four stamp areas as previously described.

Figure 22:
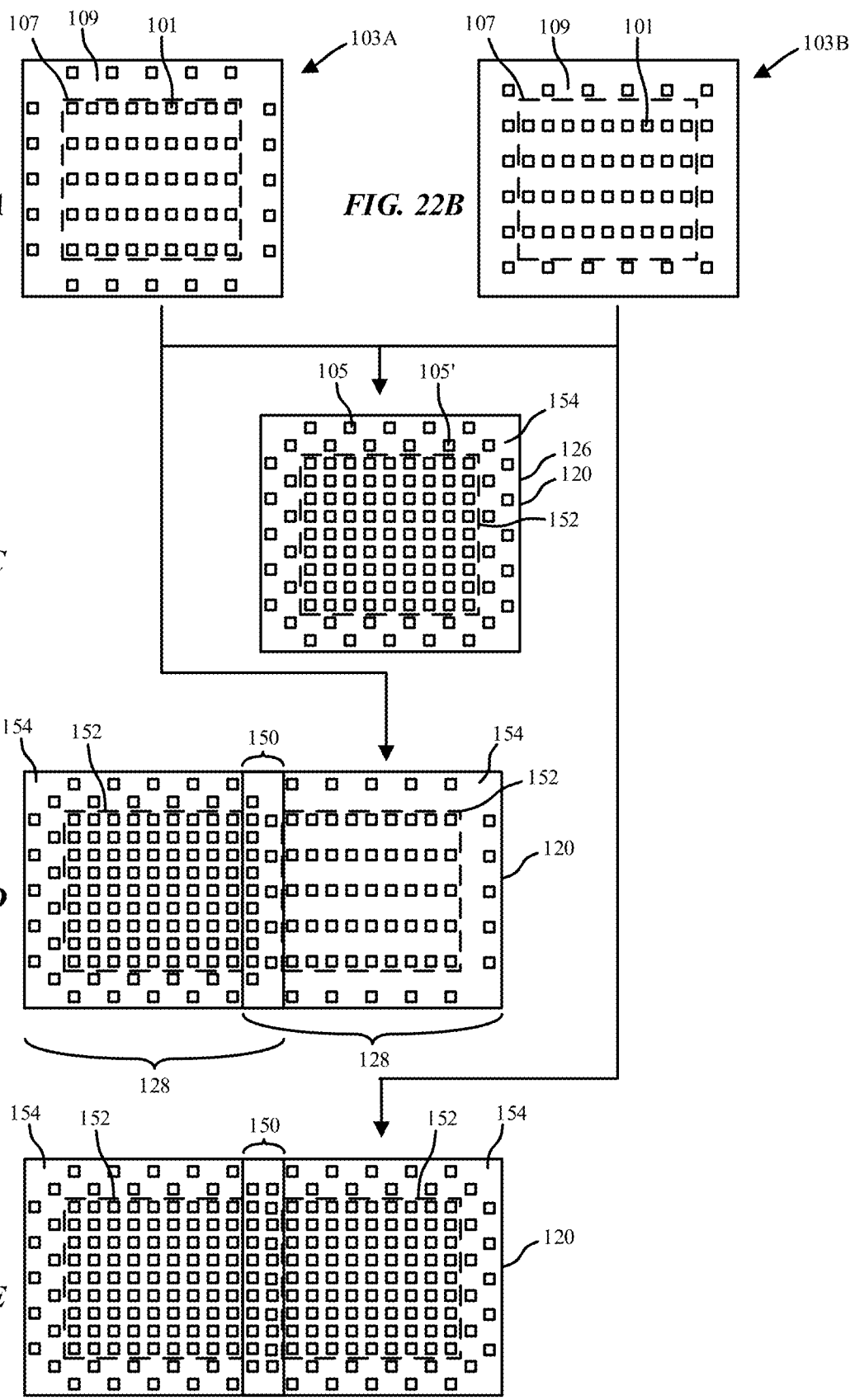
FIGS. 22A-22E are schematic bottom view illustrations of stamps and top view illustrations of display panels illustrating a process flow for populating a display panel with overlapping stamp areas in accordance with an embodiment.

Referring now to FIG. 22C, a primary array of LEDs 105 from stamp 103A and secondary array of LEDs 105' from stamp 103B can be placed onto stamp area 128 of display panel 120. Following a subsequent pick operation, stamp 103A then places LEDs 105A onto an adjacent and overlapping second stamp area 128, resulting in a partially populated fuzzy boundary 150 as illustrated in FIG. 22D. A secondary array of LEDs 105' from stamp 103B can then be placed onto the second stamp area 128 as illustrated in FIG. 22E. This process can be repeated for multiple overlapping stamp areas to complete the display panel population.

Figure 23:
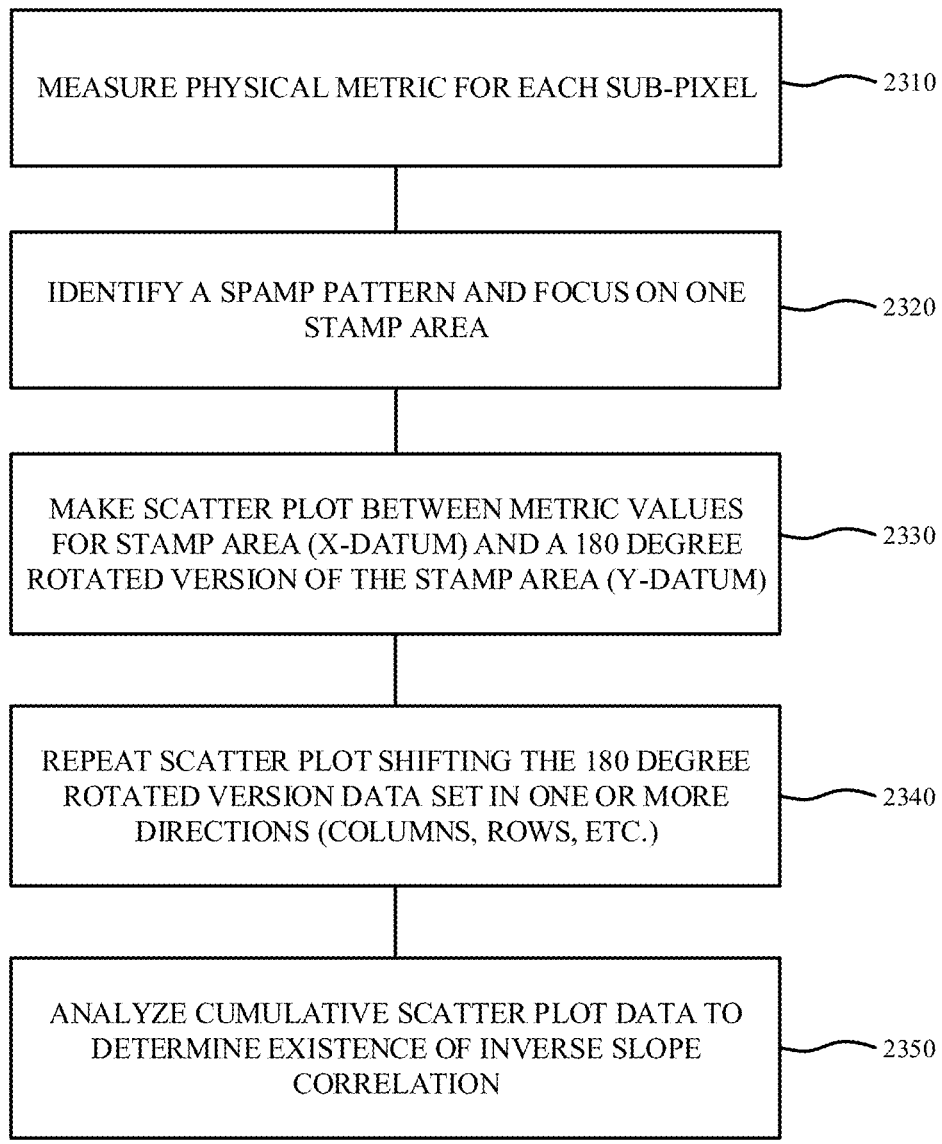
FIG. 23 is a flow chart for a method of testing a display panel to detect rotated arrays of LEDs in accordance with an embodiment.
Figure 24A:
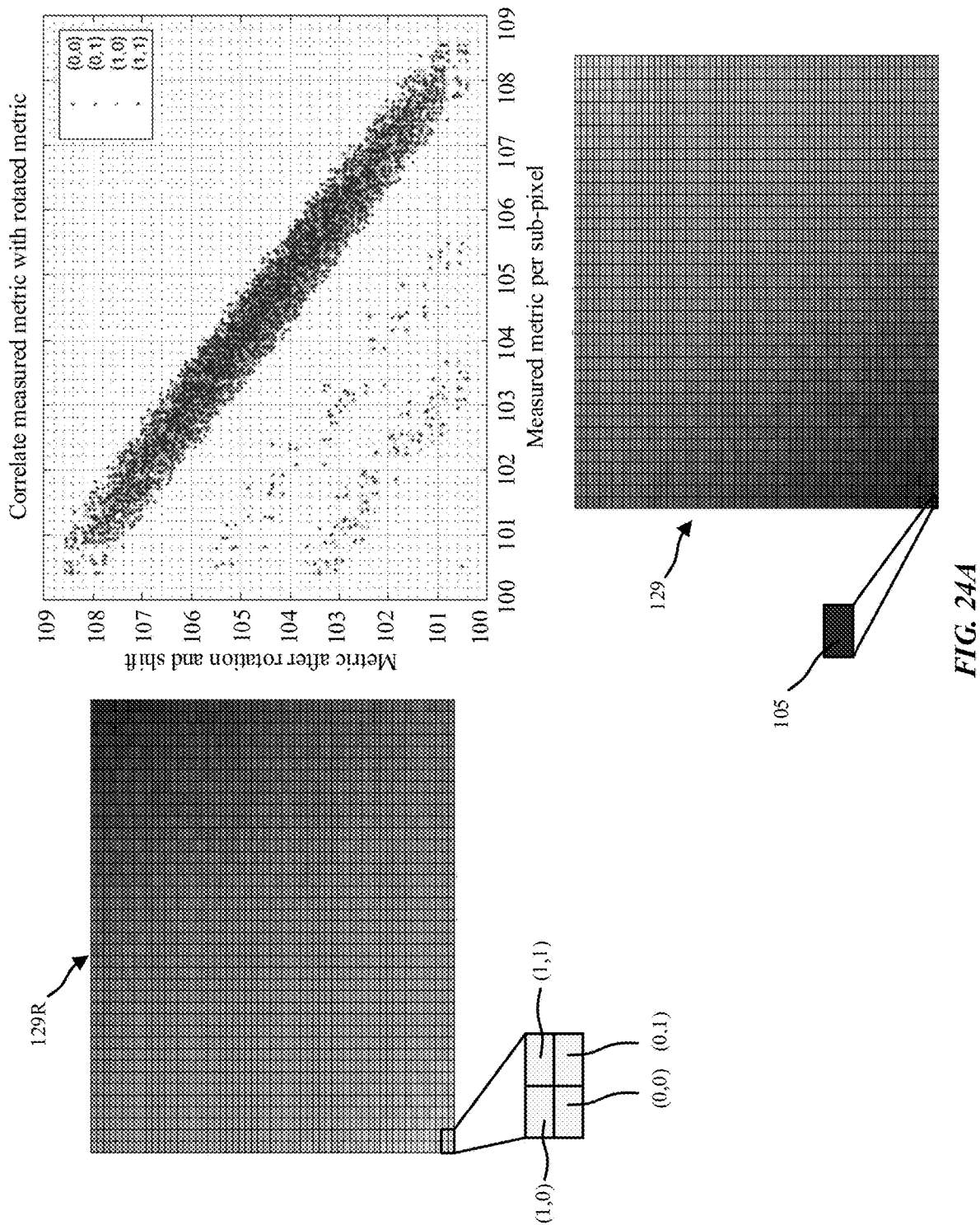
FIG. 24A is a scatter plot illustrating data test data for a stamp area without LED rotation in accordance with an embodiment.
Figure 24B:
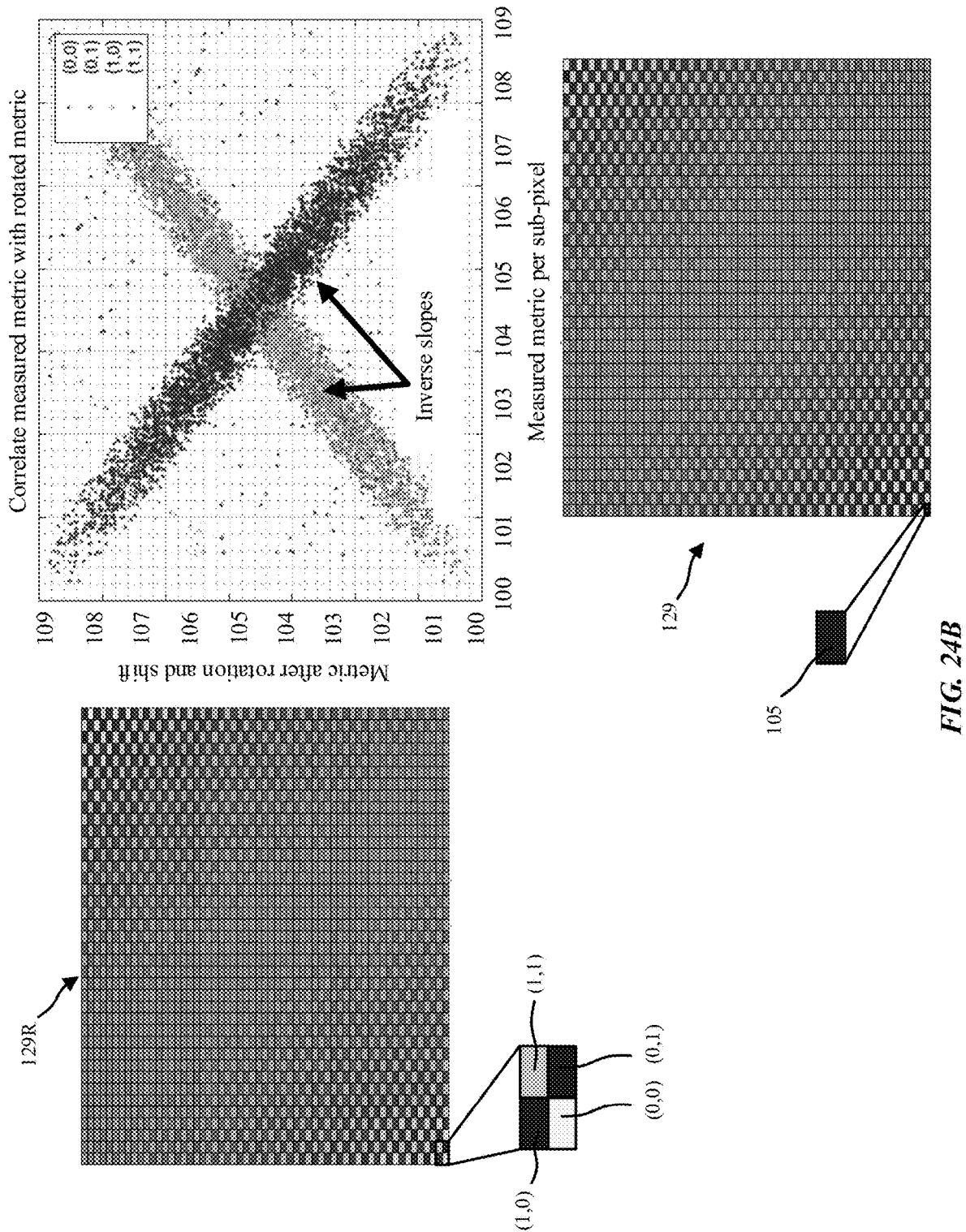
FIG. 24B is a scatter plot illustrating data test data for a stamp area with a 180 degree LED rotation in accordance with an embodiment.

It is possible to determine whether determine whether a display panel 120 includes rotated arrays of LEDs 105 in a variety of matters. FIG. 23 is a flow chart for a method of testing a display panel 120 to detect rotated arrays of LEDs 105 in accordance with an embodiment. FIG. 24A is a scatter plot illustrating data test data for a stamp area without LED rotation in accordance with an embodiment. FIG. 24B is a scatter plot illustrating data test data for a stamp area with a 180 degree LED rotation in accordance with an embodiment. In interest of clarity and conciseness, the test method of FIG. 23 is described concurrently with regard to the scatter plots of FIGS. 24A-24B.

In particular, the testing method in accordance with embodiments may be performed by focusing on specific color emitting LEDs or sub-pixels, for example, within a multi-color display panel 120. This can then be repeated for all color emitting LEDs to determine whether some or all include rotated arrays of LEDs. For example, it has been determined that some color emitting LEDs may be more susceptible to process variations than other color emitting LEDs. In particular, green-emitting LEDs may be more susceptible to color shift across a growth substrate than blue-emitting or red-emitting LEDs. Thus, a display panel may include rotation of all color-emitting LEDs or only some color-emitting LEDs, such as green, since each rotation sequence is associated with a throughput cost.

At operation 2310 a physical metric is measured for each sub-pixel, or more specifically each LED 105 for a particular color emission. The physical metric may be any of the various metrics described herein such as peak emission wavelength, FWHM, angular profile, efficiency, etc. This measurement may be performed across the entire display panel 120 and can be performed for a single color-emitting sub-pixel, or all different color-emitting sub-pixels across the display panel 120. At operation 2320 stamp patterns, which may be repeating, are identified. For example, these may correspond to the color maps (heat maps) 129 such as in FIGS. 10B, 11B, 13B, 14B. Further analysis can be focused on the data for a single color map 129 corresponding to a single stamp area 128. As this point a scatter plot for (x,y) datum can be generated between the metric values for the stamp area 128 (x-datum), and a 180 degree rotated version of the stamp area 128 (y-datum). In an embodiment, the scatter plot is generated at operation 2330 for a single color-emitting sub-pixel across the stamp area.

Referring now briefly to FIG. 24A, an exemplary color map 129 for a stamp area 128 with LED 105 corresponding to a single sub-pixel is shown underneath the scatter plat x-axis. The same color map 129 is shown as rotated 180 degrees adjacent the y-axis (rotated color map 129R). In this case the emission gradient across the rotated color map 129R is also rotated 180 degrees. The correlated scatter plot shows the same location (e.g. bottom left sub-pixel, or LED 105) will then have a different x-datum and y-datum. Performing this measurement across every sub-pixel, or LED 105, across the color map 129 and rotated color map 129R shows a negative slope data set in the exemplary scatter plot for this particular color map of stamp area 128.

At operation 2340 additional data can be provided to the scatter plot by shifting the data set taken from the rotated color map 129R in various directions (columns, rows, checkerboard, etc.) For example, this may be single even/ odd row or columns, or other sets. This idea is further illustrated in FIG. 24A, where the x-datum value for LED 105 in the lower left-hand corner has a location of (0,0). Now referring to the rotated color map 129R location (0,0) corresponds to no shift, location (0,1) corresponds to shifting one column, location (1,0) corresponds to shifting one row, and location (1,1) corresponds to shifting one row and one column. At operation 2350 the cumulative scatter plot for rotated and shifted data sets is analyzed to determine whether an inverse slope correlation exists, corresponding to rotated array of LEDs within a stamp area 128.

Figure 25:
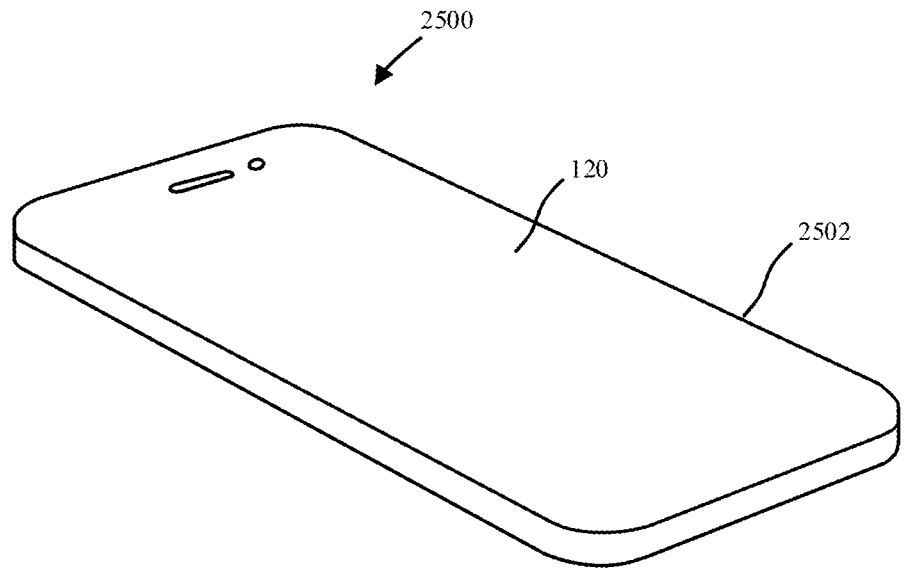
FIG. 25 is an isometric view of a mobile telephone in accordance with an embodiment.
Figure 26:
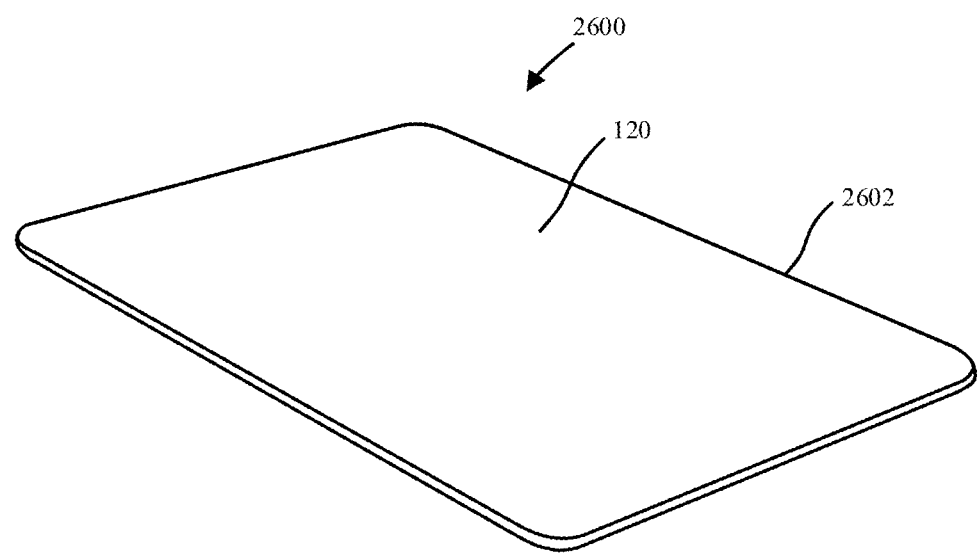
FIG. 26 is an isometric view of a tablet computing device in accordance with an embodiment.
Figure 27:
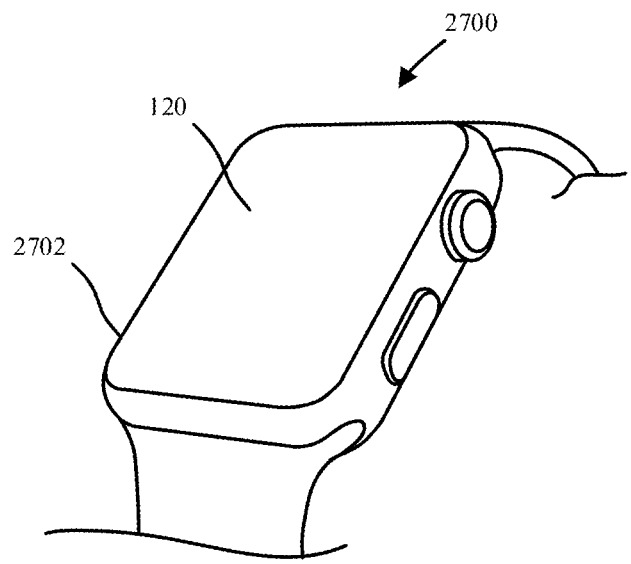
FIG. 27 is an isometric view of a wearable device in accordance with an embodiment.
Figure 28:
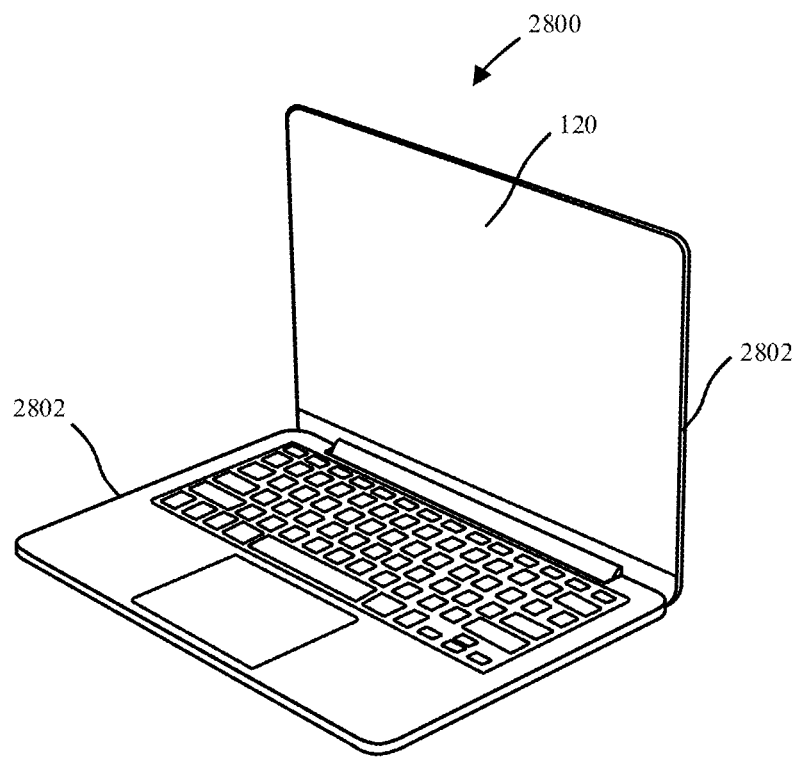
FIG. 28 is an isometric view of a laptop computer in accordance with an embodiment.

In exemplary FIG. 24A, the color map 129 is generated from array of LEDs which are not rotated. Thus, the cumulative data plot for the rotated and shifted data sets all show the same general trend, with negative slope. Referring now to FIG. 24B, the color map 129 is generated with arrays of LEDs which have been rotated 180 degrees relative to one another. As shown in the rotated color map 129R, the locations (0,0), (1,1) and (1,0), (0,1) have different values, suggesting these LEDs have been populated as rotated arrays. This is further evidenced by cumulative scatter plot that includes inverse data sets with negative slope and positive slope (corresponding to the rotated arrays of LEDs). In the particular embodiment illustrated, 180 degree rotated arrays of LEDs within the same stamp area 128 may produce inverse slopes. FIGS. 25-28 illustrate various portable electronic systems in which the various embodiments can be implemented. FIG. 25 illustrates an exemplary mobile telephone 2500 that includes a display panel 120 packaged in a housing 2502. FIG. 26 illustrates an exemplary tablet computing device 2600 that includes a display panel 120 packaged in a housing 2602. FIG. 27 illustrates an exemplary wearable device 2700 that includes a display panel 120 packaged in a housing 2702. FIG. 28 illustrates an exemplary laptop computer 2800 that includes a display panel 120 packaged in a housing 2802. In each embodiment, the display panel 120 can have stamp areas with rotated LED arrays and/or overlapping stamp areas with fuzzy boundaries.

Figure 29:
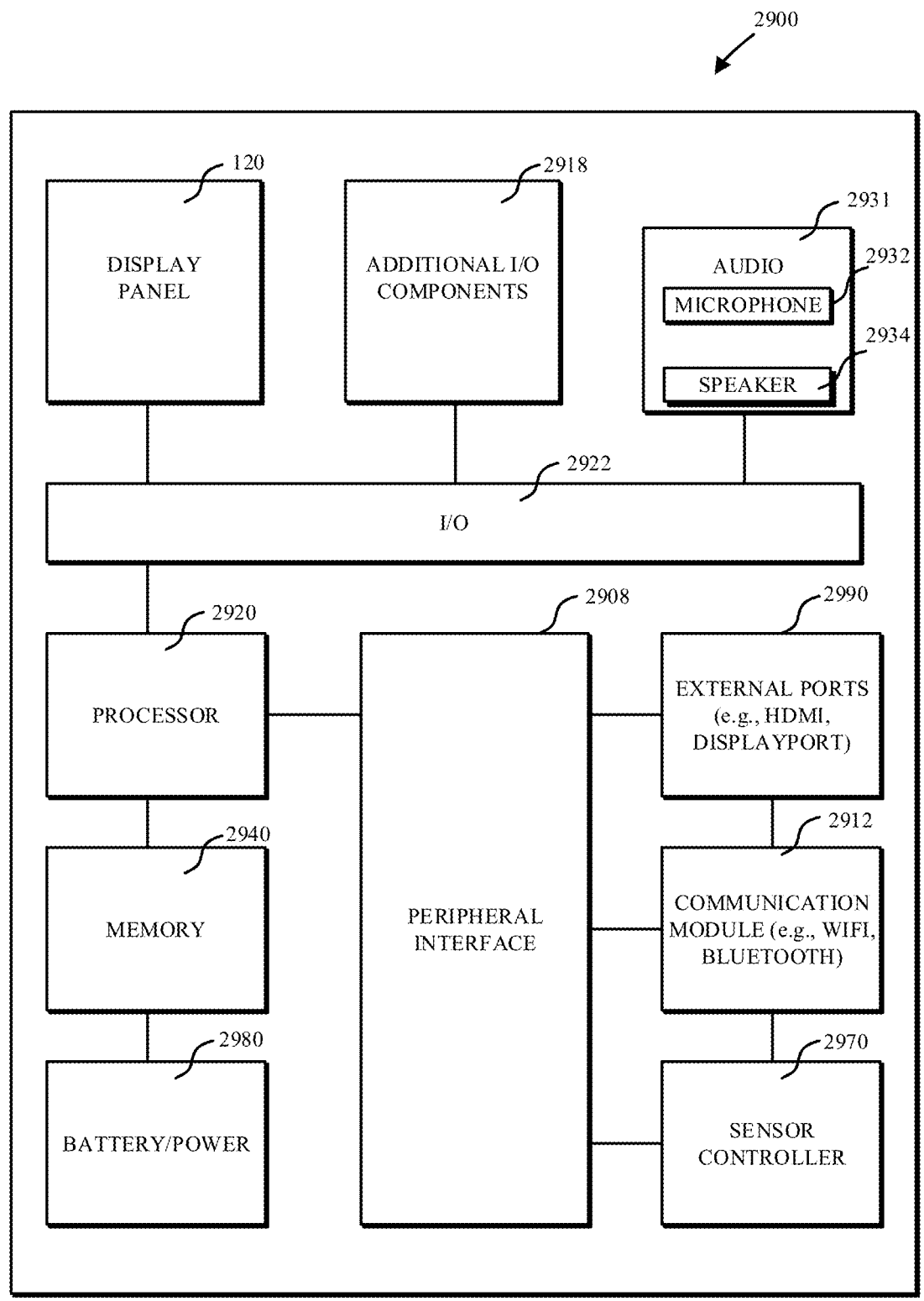
FIG. 29 is a system diagram of a portable electronic device in accordance with an embodiment.

FIG. 29 illustrates a system diagram for an embodiment of a portable electronic device 2900 including a display panel 120 described herein. The portable electronic device 2900 includes a processor 2920 and memory 2940 for managing the system and executing instructions. The memory includes non-volatile memory, such as flash memory, and can additionally include volatile memory, such as static or dynamic random access memory (RAM). The memory 2940 can additionally include a portion dedicated to read only memory (ROM) to store firmware and configuration utilities.

The system also includes a power module 2980 (e.g., flexible batteries, wired or wireless charging circuits, etc.), a peripheral interface 2908, and one or more external ports 2990 (e.g., Universal Serial Bus (USB), HDMI, Display Port, and/or others). In one embodiment, the portable electronic device 2900 includes a communication module 2912 configured to interface with the one or more external ports 2990. For example, the communication module 2912 can include one or more transceivers functioning in accordance with IEEE standards, 3GPP standards, or other communication standards, 4G, 5G, etc. and configured to receive and transmit data via the one or more external ports 2990. The communication module 2912 can additionally include one or more WWAN transceivers configured to communicate with a wide area network including one or more cellular towers, or base stations to communicatively connect the portable electronic device 2900 to additional devices or components.

Further, the communication module 2912 can include one or more WLAN and/or WPAN transceivers configured to connect the portable electronic device 2900 to local area networks and/or personal area networks, such as a Bluetooth network.

The portable electronic device 2900 can further include a sensor controller 2970 to manage input from one or more sensors such as, for example, proximity sensors, ambient light sensors, or infrared transceivers. In one embodiment the system includes an audio module 2931 including one or more speakers 2934 for audio output and one or more microphones 2932 for receiving audio. In embodiments, the speaker 2934 and the microphone 2932 can be piezoelectric components. The portable electronic device 2900 further includes an input/output (I/O) controller 2922, a display panel 120, and additional I/O components 2918 (e.g., keys, buttons, lights, LEDs, cursor control devices, haptic devices, and others). The display panel 120 and the additional I/O components 2918 may be considered to form portions of a user interface (e.g., portions of the portable electronic device 2900 associated with presenting information to the user and/or receiving inputs from the user).

In utilizing the various aspects of the embodiments, it would become apparent to one skilled in the art that combinations or variations of the above embodiments are possible for forming a display panel with rotated arrays of LEDs and/or overlapping stamp areas. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
a stamp area;
a first array of light emitting diodes (LEDs) characterized by a first emission gradient from a first perimeter location of the stamp area to a second perimeter location of the stamp area opposite the first perimeter location; and
a second array of LEDs adjacent to and overlapping the first array of LEDs, the second array of LEDs characterized by a second emission gradient that is rotated relative to the first emission gradient.

2. The display panel of claim 1, wherein:
the second emission gradient is rotated 180 degrees relative to the first emission gradient such that the second emission gradient is opposite of the first emission gradient from the first perimeter location of the stamp area to the second perimeter location of the stamp area; and
the first perimeter location is selected from the group consisting of a first side of the stamp area and a first corner of the stamp area.

3. The display panel of claim 1, wherein the first array of LEDs and the second array of LEDs have a same color emission.

4. The display panel of claim 1, wherein the first emission gradient has a variation of peak emission wavelengths of less than 10 μm.

5. The display panel of claim 1, wherein the stamp area is characterized by a dE 2000 value of less than 3 along both the first perimeter location and the second perimeter location of the stamp area.

6. The display panel of claim 1, wherein:
the first emission gradient is characterized by peak emission wavelengths of the first array of LEDs; and
the second emission gradient is characterized by peak emission wavelengths of the second array of LEDs.

7. The display panel of claim 6, further comprising:
a third array of light emitting diodes (LEDs) characterized by a third emission gradient from a third perimeter location of the stamp area to a fourth perimeter location of the stamp area opposite the third perimeter location;
a fourth array of LEDs adjacent to and overlapping the third array of LEDs, the fourth array of LEDs characterized by a fourth emission gradient;
wherein the first array of LEDs and the second array of LEDs have a same first color emission; and
wherein the third array of LEDs and the fourth array of LEDs have a same second color emission different from the first color emission.

8. The display panel of claim 7, wherein the fourth emission gradient is not rotated relative to the third emission gradient.

9. The display panel of claim 7, wherein the fourth emission gradient is rotated relative to the third emission gradient.

10. A display panel comprising:
an array of stamp areas distributed across the display panel;
each stamp area including a first array of light emitting diodes (LEDs) characterized by a first emission gradient from a first perimeter location of the stamp area to a second perimeter location of the stamp area opposite the first perimeter location; and
a second array of LEDs adjacent the first array of LEDs, the second array of LEDs characterized by an emission gradient that is rotated relative to the first emission gradient.

11. The display panel of claim 10, wherein the second emission gradient is rotated 180 degrees relative to the first emission gradient from the first perimeter location of the stamp area to the second perimeter location of the stamp area.

12. The display panel of claim 10, wherein the stamp areas of the array of stamp areas do not overlap one another.

13. The display panel of claim 10, wherein the stamp areas of the array of stamp areas overlap one another.

14. The display panel of claim 10, wherein the first array of LEDs and the second array of LEDs are in alternating display rows.

15. The display panel of claim 10, wherein the first array of LEDs and the second array of LEDs in same display rows.

16. A method of populating a display panel comprising:
placing a first array of LEDs from a first region of a donor substrate onto a first stamp area on the display panel; and
placing a second array of LEDs from the first region of the donor substrate onto the first stamp area on the display panel, wherein the second array of LEDs is rotated relative to the first array of LEDs.

17. The method of claim 16, further comprising rotating the display panel after placing the first array of LEDs, and prior to placing the second array of LEDs.

18. The method of claim 16, further comprising:
picking up the first array of LEDs from the donor substrate;
picking up the second array of LEDs from the donor substrate; and rotating the donor substrate after picking up the first array of LEDs and prior to picking up the second array of LEDs.

19. The method of claim 16, further comprising:

picking up the first array of LEDs from the donor substrate with a first stamp; and picking up the second array of LEDs from the donor substrate with a second stamp separate from the first stamp.

20. The method of claim 16, wherein the first array of LEDs is rotated 180 degrees relative to the second array of LEDs.

\* \* \* \* \*